(12) United States Patent
Vellianitis et al.

(10) Patent No.: US 12,543,323 B2
(45) Date of Patent: Feb. 3, 2026

(54) FERROELECTRIC MEMORY DEVICE WITH RELAXATION LAYERS

(71) Applicant: Taiwan Semiconductor Manufacturing Company, Ltd., Hsinchu (TW)

(72) Inventors: Georgios Vellianitis, Heverlee (BE); Marcus Johannes Henricus Van Dal, Linden (BE); Gerben Doornbos, Kessel-Lo (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 818 days.

(21) Appl. No.: 17/591,205

(22) Filed: Feb. 2, 2022

(65) Prior Publication Data
US 2023/0292524 A1    Sep. 14, 2023

(51) Int. Cl.
*H10B 53/30*    (2023.01)

(52) U.S. Cl.
CPC ............................ *H10B 53/30* (2023.02)

(58) Field of Classification Search
CPC ......... H10B 53/30; H10B 51/30; H01L 28/56; H01L 28/55; H01L 29/6684; H01L 28/04
USPC ........................................................ 257/295
See application file for complete search history.

(56) References Cited

U.S. PATENT DOCUMENTS

| | | | |
|---|---|---|---|
| 5,561,307 A * | 10/1996 | Mihara | H10B 12/033 204/192.15 |
| 6,229,166 B1 | 5/2001 | Kim et al. | |
| 6,235,573 B1 * | 5/2001 | Lee | H10B 53/00 257/311 |
| 10,319,806 B2 * | 6/2019 | Rodriguez | H10D 1/684 |
| 10,475,738 B2 * | 11/2019 | Lee | H01L 23/5223 |
| 11,158,701 B2 * | 10/2021 | Lee | H01G 4/33 |
| 2001/0005026 A1 * | 6/2001 | Nakamura | H10D 1/716 257/E21.018 |

(Continued)

FOREIGN PATENT DOCUMENTS

| | | |
|---|---|---|
| CN | 109256386 A | 1/2019 |
| CN | 113130498 A | 7/2021 |

(Continued)

OTHER PUBLICATIONS

Alsaad et al. "Piezoelectricity of ordered (ScxGa1-xN) alloys from first principles" Eur. Phys. J. B 54, 151-156 (2006), published on Dec. 13, 2006.

(Continued)

*Primary Examiner* — Duy T Nguyen
*Assistant Examiner* — Pratiksha Jayant Lohakare
(74) *Attorney, Agent, or Firm* — Eschweiler & Potashnik, LLC

(57) ABSTRACT

The present disclosure relates to an integrated chip including a ferroelectric layer. The ferroelectric layer includes a ferroelectric material. A first relaxation layer including a first material, different from the ferroelectric material, is on a first side of the ferroelectric layer. A second relaxation layer including a second material, different from the ferroelectric material, is on a second side of the ferroelectric layer, opposite the first side. A Young's modulus of the first relaxation layer is less than a Young's modulus of the ferroelectric layer.

20 Claims, 19 Drawing Sheets

(56) References Cited

U.S. PATENT DOCUMENTS

| | | | | |
|---|---|---|---|---|
| 2004/0108531 A1* | 6/2004 | Murayama | ............ | H10D 1/716 |
| | | | | 257/E21.018 |
| 2008/0054316 A1* | 3/2008 | Xiang | ............... | H01L 29/78639 |
| | | | | 257/E21.415 |
| 2008/0121954 A1* | 5/2008 | Shuto | ..................... | H01L 28/91 |
| | | | | 257/295 |
| 2008/0179645 A1* | 7/2008 | Nakamura | ........ | H01L 21/76832 |
| | | | | 257/295 |
| 2009/0275146 A1* | 11/2009 | Takano | ................... | H01L 28/55 |
| | | | | 156/345.31 |
| 2014/0269033 A1* | 9/2014 | Natori | .................... | H10B 61/22 |
| | | | | 365/158 |
| 2019/0019801 A1 | 1/2019 | Yoo | | |
| 2019/0074295 A1 | 3/2019 | Schroeder | | |
| 2020/0058658 A1 | 2/2020 | Heo et al. | | |
| 2021/0151445 A1* | 5/2021 | Wagner | ................ | H10D 64/689 |
| 2021/0359100 A1 | 11/2021 | Maeng et al. | | |

FOREIGN PATENT DOCUMENTS

| | | |
|---|---|---|
| CN | 113690226 A | 11/2021 |
| JP | 2004296919 A * | 10/2004 |

OTHER PUBLICATIONS

Deng et al. "Bandgap in Al12xScxN" Appl. Phys. Lett. 102, 112103 (2013), published on Mar. 18, 2013.

Zhang et al. "Tunable optoelectronic and ferroelectric properties in Sc-based III-nitrides" J. Appl. Phys. 114, 133510 (2013), published on Oct. 4, 2013.

\* cited by examiner

FERROELECTRIC MEMORY DEVICE WITH RELAXATION LAYERS

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include ferroelectric random-access memory (FeRAM), magnetoresistive random-access memory (MRAM), resistive random-access memory (RRAM), phase-change random-access memory (PCRAM), and conductive-bridging random-access memory (CBRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
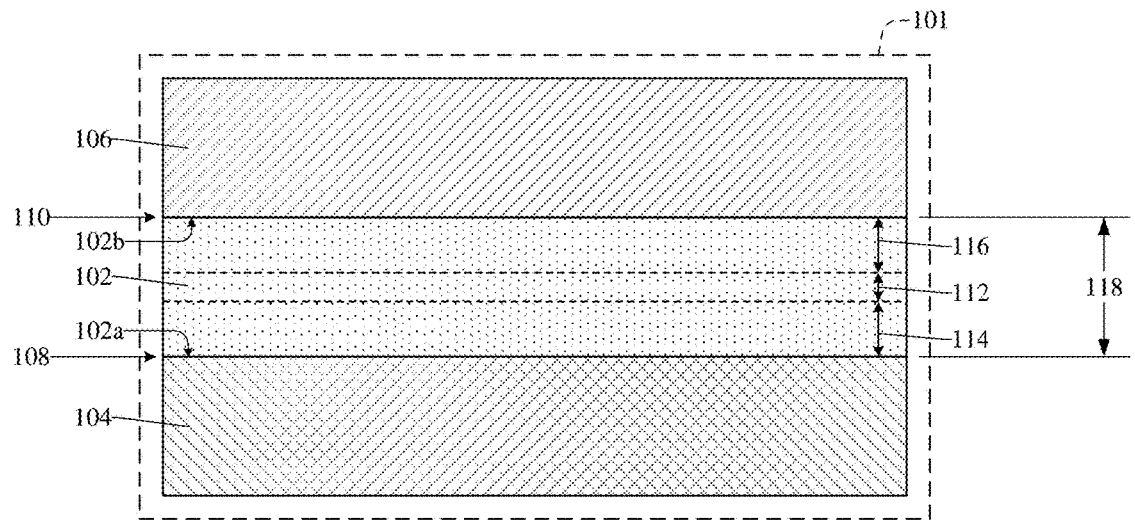
FIG. 1 illustrates a cross-sectional view of some embodiments of a ferroelectric structure comprising a ferroelectric layer and a first relaxation layer neighboring the ferroelectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips include memory devices. For example, some integrated chips include ferroelectric random-access memory (FeRAM) devices that include a plurality of FeRAM memory cells. Some FeRAM memory cells include a ferroelectric capacitor coupled to a transistor device. For example, a transistor device is disposed along a substrate and a ferroelectric capacitor is arranged over the transistor device. The ferroelectric capacitor includes a ferroelectric layer between a lower metal layer and an upper metal layer. The ferroelectric capacitor may be coupled to a source/drain of the transistor device.

An FeRAM memory cell can be read and/or written by applying an electric field to the ferroelectric layer (i.e., by applying a voltage across the ferroelectric layer). When the electric field is applied to the ferroelectric layer, the ferroelectric layer is polarized in a first direction (e.g., corresponding to a logic "0") or a second direction (e.g., corresponding to a logic "1"), opposite the first direction, depending on the direction of the applied electric field (i.e., depending on the sign of the voltage applied across the ferroelectric layer).

In some devices, the ferroelectric properties (e.g., a polarization or the like) of the ferroelectric layer are dependent on both the material(s) of the ferroelectric layer and the material(s) of neighboring layers (e.g., the lower metal layer and the upper metal layer) that contact the ferroelectric layer at interfaces with the ferroelectric layer. Further, in some devices where the ferroelectric layer has a small thickness (e.g., a thickness of less than 30 nanometers or the like), the ferroelectric properties of the ferroelectric layer may largely depend on the material properties of the neighboring layers at the interfaces rather than the material properties of the ferroelectric layer itself.

A challenge with some devices having a substantially thin ferroelectric layer is that if the neighboring layers are not conducive to the ferroelectricity of the ferroelectric layer, the ferroelectric properties of the ferroelectric layer may be reduced or eliminated. For example, in some devices, the neighboring layers are stiff (e.g., have a high Young's modulus) and thus can strain the ferroelectric layer at the interfaces. This strain may prevent the ferroelectric layer from "relaxing" (i.e., deforming, transitioning, etc.) into its proper ferroelectric phase when an electric field is applied. In other words, the strain induced on the ferroelectric layer by the neighboring layers may diminish the ferroelectric properties of the ferroelectric layer. As a result, a performance of the memory cell may be reduced.

Various embodiments of the present disclosure are related to a memory cell including a ferroelectric layer and a first relaxation layer, neighboring the ferroelectric layer, for improving a performance of the memory cell. The ferroelectric layer has a substantially small thickness. The ferroelectric layer has a first side and a second side, opposite the first side. The first relaxation layer is on the first side of the ferroelectric layer. The first relaxation layer abuts the ferroelectric layer at a first interface. A Young's modulus of the first relaxation layer is substantially low. For example, a Young's modulus of the first relaxation layer is less than a Young's modulus of the ferroelectric layer.

By including the first relaxation layer in the memory cell, a performance of the memory cell having may be improved. For example, because the first relaxation layer has a substantially low Young's modulus (corresponding to a low stiffness), a strain on the ferroelectric layer may be reduced. Thus, the ferroelectric layer may be able to "relax" into its proper ferroelectric phase when an electric field is applied. In other words, the ferroelectric layer may maintain its ferroelectric properties despite the thickness of the ferroelectric layer being substantially small. Thus, a performance of a memory cell may be improved.

In some embodiments, the memory cell further includes a second relaxation layer on the second side of the ferroelectric layer. The second relaxation layer abuts the ferroelectric layer at a second interface. In some embodiments, a Young's modulus of the second relation layer is less than the Young's modulus of the ferroelectric layer. Thus, by including the second relaxation layer in the memory cell, the performance of the memory cell may be further improved.

FIG. 1 illustrates a cross-sectional view 100 of some embodiments of a ferroelectric structure 101 comprising a ferroelectric layer 102 and a first relaxation layer 104 neighboring the ferroelectric layer 102.

The ferroelectric layer 102 has a first surface 102a on a first side of the ferroelectric layer 102. The ferroelectric layer 102 has a second surface 102b, opposite the first surface 102a, on a second side of the ferroelectric layer 102, opposite the first side.

The first relaxation layer 104 is on the first side of the ferroelectric layer 102. The first relaxation layer 104 abuts the first surface 102a of the ferroelectric layer 102 along a first interface 108. In some embodiments, the first relaxation layer 104 is in direct contact with the first surface 102a of the ferroelectric layer 102.

The ferroelectric structure 101 further includes a second relaxation layer 106 on the second side of the ferroelectric layer 102. The second relaxation layer 106 abuts the second surface 102b of the ferroelectric layer 102 along a second interface 110. In some embodiments, the second relaxation layer 106 is in direct contact with the second surface 102b of the ferroelectric layer 102.

In some embodiments, the ferroelectric layer 102 has a first interface region 114 (e.g., a boundary region of the ferroelectric layer 102 which extends along the first interface 108), a second interface region 116 (e.g., a boundary region of the ferroelectric layer 102 which extends along the second interface 110), and a bulk region 112 (e.g., a central region of the ferroelectric layer 102 that is separated from the first relaxation layer 104 and the second relaxation layer 106 by interface regions 114, 116 of the ferroelectric layer 102). Along the bulk region 112, the ferroelectric properties of the ferroelectric layer 102 may depend largely on the properties of the bulk material (e.g., the material(s) of the ferroelectric layer 102). Along the interface regions 114, 116, the ferroelectric properties of the ferroelectric layer 102 may depend largely on the properties of the materials at the interfaces (e.g., the materials of the first relaxation layer 104 and the second relaxation layer 106).

In some embodiments, the ferroelectric layer 102 has a substantially small thickness 118 (e.g., about 30 nanometers or less, about 20 nanometers or less, about 15 nanometers or less, between 30 nanometers and 5 nanometers, or some other suitable thickness) to reduce a size of the memory cell. In such embodiments, the thickness of the bulk region 112 may be small or zero. Consequently, the ferroelectric properties (e.g., polarization or the like) of the ferroelectric layer 102 may largely depend on the material(s) at the interfaces 108, 110 instead of the bulk material properties.

In some embodiments, a Young's modulus (corresponding to stiffness) of the first relaxation layer 104 is substantially low. For example, the Young's modulus of the first relaxation layer 104 is less than a Young's modulus of the ferroelectric layer 102. Thus, the first relaxation layer 104 may reduce a strain on the ferroelectric layer 102 along the first interface 108. Consequently, the ferroelectric layer 102 may be able to "relax" (e.g., deform, transition, etc.) into its proper ferroelectric phase along the first interface region 114 when an electric field is applied. Thus, despite the ferroelectric layer 102 having a substantially small thickness 118, the ferroelectric properties of the ferroelectric layer 102 may be preserved.

Further, in some embodiments, a Young's modulus of the second relaxation layer 106 is less than the Young's modulus of the ferroelectric layer 102. Thus, the second relaxation layer 106 may reduce a strain on the ferroelectric layer 102 along the second interface 110. As a result, the ferroelectric properties of the ferroelectric layer 102 may be further improved.

Additionally, or alternatively, in some embodiments, a lattice constant (e.g., an a-axis lattice parameter, where the a-axis extends horizontally along a width of the ferroelectric structure 101 and perpendicular to a c-axis that extends vertically along a height of the ferroelectric structure 101) of the first relaxation layer 104 is substantially different from a lattice constant (e.g., an a-axis lattice parameter) of the ferroelectric layer 102. For example, a difference (e.g., a percentage difference) between the lattice constant of the first relaxation layer 104 and the ferroelectric layer 102 is greater than a threshold difference. In some embodiments, the threshold difference is equal to 1 percent. In some other embodiments, the threshold difference is equal to 2 percent. In some other embodiments, the threshold difference is equal to 3 percent or some other suitable value. Because the first relaxation layer 104 and the ferroelectric layer 102 have substantially different lattice constants, a strain on the ferroelectric layer 102 along the first interface 108 may be reduced. As a result, the ferroelectric properties along the first interface region 114 of the ferroelectric layer 102 may be further improved.

Further, in some embodiments, a lattice constant (e.g., an a-axis lattice parameter) of the second relaxation layer 106 is substantially different from the lattice constant (e.g., an a-axis lattice parameter) of the ferroelectric layer 102. For example, a difference (e.g., a percentage difference) between the lattice constant of the second relaxation layer 106 and the ferroelectric layer 102 is greater than the threshold difference. Because the second relaxation layer 106 and the ferroelectric layer 102 have substantially different lattice constants, a strain on the ferroelectric layer along the second interface 110 may be reduced. As a result, the ferroelectric properties along the second interface region 116 of the ferroelectric layer 102 may be further improved. In some instances, the greater the difference between the lattice constant of the ferroelectric layer 102 and the lattice constants of neighboring layers (e.g., the first relaxation layer 104 and the second relaxation layer 106), the lesser the strain on the ferroelectric layer 102.

In some embodiments, the first relaxation layer 104 comprises a metal such as, for example, molybdenum, magnesium, aluminum, titanium, some titanium alloy, copper, cobalt, or some other suitable material. In some other embodiments, the first relaxation layer 104 comprises a semiconductor such as, for example, silicon, germanium, indium gallium zinc oxide (IGZO), or some other suitable material. In some other embodiments, the first relaxation layer 104 comprises a dielectric such as, for example, hafnium oxide or some other suitable material. In some embodiments, a thickness of the first relaxation layer 104 is greater than or equal to a thickness of the ferroelectric layer 102.

In some embodiments, the second relaxation layer 106 comprises a metal such as, for example, molybdenum, magnesium, aluminum, titanium, some titanium alloy, copper, cobalt, or some other suitable material. In some embodiments, a thickness of the second relaxation layer 106 is greater than or equal to a thickness of the ferroelectric layer 102.

In some embodiments, the first relaxation layer 104 and the second relaxation layer 106 comprise different material(s). In some other embodiments, the first relaxation layer 104 and the second relaxation layer 106 comprise the same material(s). Further, the first relaxation layer 104 and the second relaxation layer 106 comprise different materials than the ferroelectric layer 102.

In some embodiments, the ferroelectric layer 102 comprises a doped Group III (e.g., aluminum, gallium, or indium) nitride such as, for example, aluminum scandium nitride, indium scandium nitride, gallium scandium nitride, magnesium doped gallium nitride, zinc doped indium nitride, yttrium doped aluminum nitride, or some other suitable material. In some embodiments, the dopant percentage of the ferroelectric layer 102 is between 20 percent and 45 percent, or some other suitable range.

Although layer 104 is referred to as the first relaxation layer and layer 106 is referred to as the second relaxation layer, it will be appreciated that the numbering is generic and may be changed. For example, layer 104 can alternatively be referred to as the second relaxation layer and layer 106 can alternatively referred to as the first relaxation layer.

Figure 2:
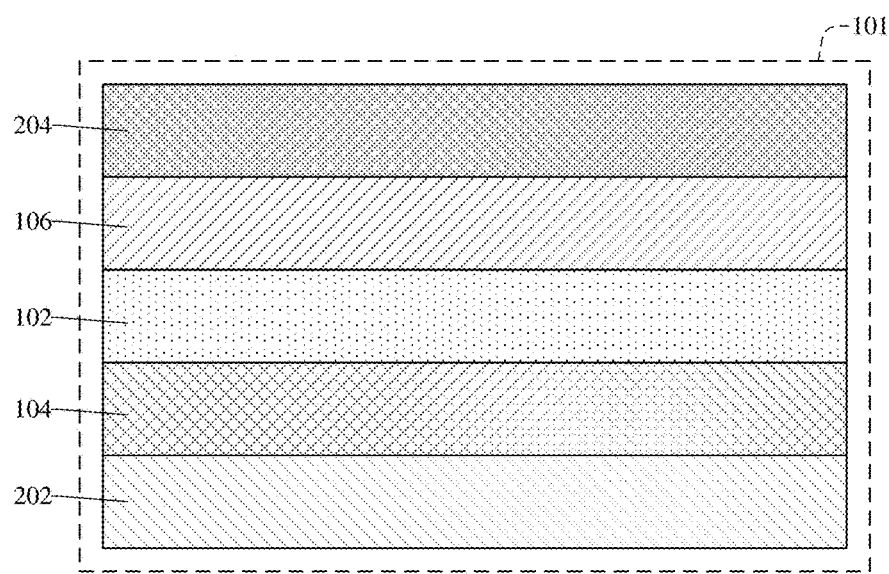
FIG. 2 illustrates a cross-sectional view of some embodiments of the ferroelectric structure of FIG. 1 in which the ferroelectric structure further comprises one or more outer layers.

FIG. 2 illustrates a cross-sectional view 200 of some embodiments of the ferroelectric structure 101 of FIG. 1 in which the ferroelectric structure 101 further comprises one or more outer layers.

In some embodiments, the ferroelectric structure 101 includes a first outer layer 202 on the first side of the ferroelectric layer 102. The first relaxation layer 104 is between the first outer layer 202 and the ferroelectric layer 102. In some embodiments, the first outer layer 202 is in direct contact with the first relaxation layer 104. In some embodiments, the first outer layer 202 is a conductive layer which may, for example, comprise copper, cobalt, tungsten, aluminum, titanium, tantalum, ruthenium, or some other suitable material. In some other embodiments, the first outer layer 202 is a semiconductor layer which may, for example, comprise silicon, germanium, or some other suitable material. In some other embodiments, the first outer layer 202 is a dielectric layer which may, for example, comprise silicon dioxide, silicon nitride, aluminum oxide, hafnium oxide, zirconium oxide, or some other suitable material.

In some embodiments, the ferroelectric structure 101 may additionally or alternatively include a second outer layer 204. The second outer layer 204 is on the second side of the ferroelectric layer 102. The second relaxation layer 106 is between the second outer layer 204 and the ferroelectric layer 102. In some embodiments, the second outer layer 204 is in direct contact with the second relaxation layer 106. In some embodiments, the second outer layer 204 is a conductive layer which may, for example, comprise copper, cobalt, tungsten, aluminum, titanium, tantalum, ruthenium, or some other suitable material. In some embodiments, the first outer layer 202 and the second outer layer 204 comprise different materials than the first relaxation layer 104, the second relaxation layer 106, and the ferroelectric layer 102.

In some embodiments (e.g., in embodiments where the ferroelectric structure 101 includes the first outer layer 202), the first relaxation layer 104 may comprise a metal, dielectric, a ferroelectric, or an anti-ferroelectric. For example, first relaxation layer 104 may comprise zirconium doped hafnium oxide, aluminum doped hafnium oxide, silicon doped hafnium oxide, scandium doped hafnium oxide, cerium doped hafnium oxide, gadolinium doped hafnium oxide, lanthanum doped hafnium oxide, yttrium doped hafnium oxide, magnesium oxide, molybdenum, magnesium, aluminum, titanium, a titanium alloy, or some other suitable material. In some such embodiments, the first relaxation layer 104 has a thickness that is less than a thickness of the ferroelectric layer 102. For example, the thickness of the first relaxation layer 104 is about 5 nanometers, is less than about 5 nanometers, is between 5 nanometers and 0.5 nanometers, or is some other suitable value.

In some embodiments (e.g., in embodiments where the ferroelectric structure 101 includes the second outer layer 204), the second relaxation layer 106 may comprise a metal, dielectric, a ferroelectric, or an anti-ferroelectric. For example, second relaxation layer 106 may comprise zirconium doped hafnium oxide, aluminum doped hafnium oxide, silicon doped hafnium oxide, scandium doped hafnium oxide, cerium doped hafnium oxide, gadolinium doped hafnium oxide, lanthanum doped hafnium oxide, yttrium doped hafnium oxide, magnesium oxide, molybdenum, magnesium, aluminum, titanium, a titanium alloy, or some other suitable material. In some such embodiments, second relaxation layer 106 has a thickness that is less than a thickness of the ferroelectric layer 102. For example, in some such embodiments, the thickness of the second relaxation layer 106 is about 5 nanometers or less, between 5 nanometers and 0.5 nanometers, or some other suitable value.

In some embodiments, the first relaxation layer 104 and/or the second relaxation layer 106 may comprise amorphous solids. Because amorphous solids have low stiffness, a strain on the ferroelectric layer 102 may be reduced. As a result, the ferroelectric properties of the ferroelectric layer 102 may be preserved despite the thickness of the ferroelectric layer 102 being substantially small.

In some embodiments, the thickness of the ferroelectric layer 102 is less than the thickness of the first outer layer 202 and less than the thickness of the second outer layer 204. In some embodiments, the thickness of the ferroelectric layer 102 is greater than a sum of the thickness of the first relaxation layer 104 plus the thickness of the second relaxation layer 106.

FIGS. 3A-3D illustrate cross-sectional views 300a-300d of some embodiments of a memory cell including a ferroelectric structure 101.

In some embodiments, the memory cell is one of a plurality of memory cells included in a memory device of an integrated chip. The memory cell includes a transistor device 302 along a substrate 304. The transistor device 302 includes a pair of source/drains 306 along the substrate 304 and a channel 308 extending between the pair of source/drains 306. Further, a gate electrode 310 over is the substrate 304 between the pair of source/drains 306. The gate electrode 310 is separated from the channel 308 by a gate dielectric layer 312. A dielectric structure 314 is over the substrate 304. Contacts 316 are within the dielectric structure 314 and extend through the dielectric structure 314 to the source/drains 306 and the gate electrode 310. The ferroelectric structure 101 is over the transistor device 302 and forms a ferroelectric capacitor. In some embodiments, the ferroelectric structure 101 is coupled to a source/drain 306 by a contact 316. In some embodiments, the ferroelectric structure 101 is electrically arranged in series with the contact 316.

Figure 3A:
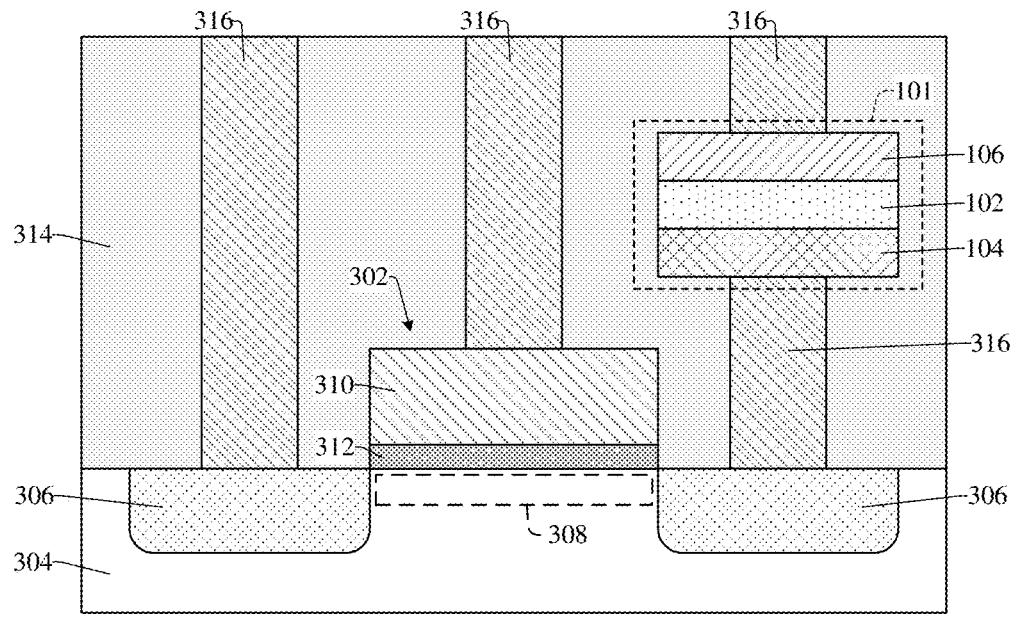
FIGS. 3A-3D illustrate cross-sectional views of some embodiments of a memory cell including a ferroelectric structure.

In some embodiments (e.g., as illustrated in FIG. 3A), the ferroelectric structure 101 includes a ferroelectric layer 102, a first relaxation layer 104, and a second relaxation layer 106 within the dielectric structure 314. In some such embodiments, the first relaxation layer 104 comprises a metal having a substantially low Young's modulus and/or a lattice constant that is substantially different from that of the ferroelectric layer 102. In some such embodiments, the second relaxation layer 106 comprises a metal having a substantially low Young's modulus and/or a lattice constant that is substantially different from that of the ferroelectric layer 102.

Figure 3B:
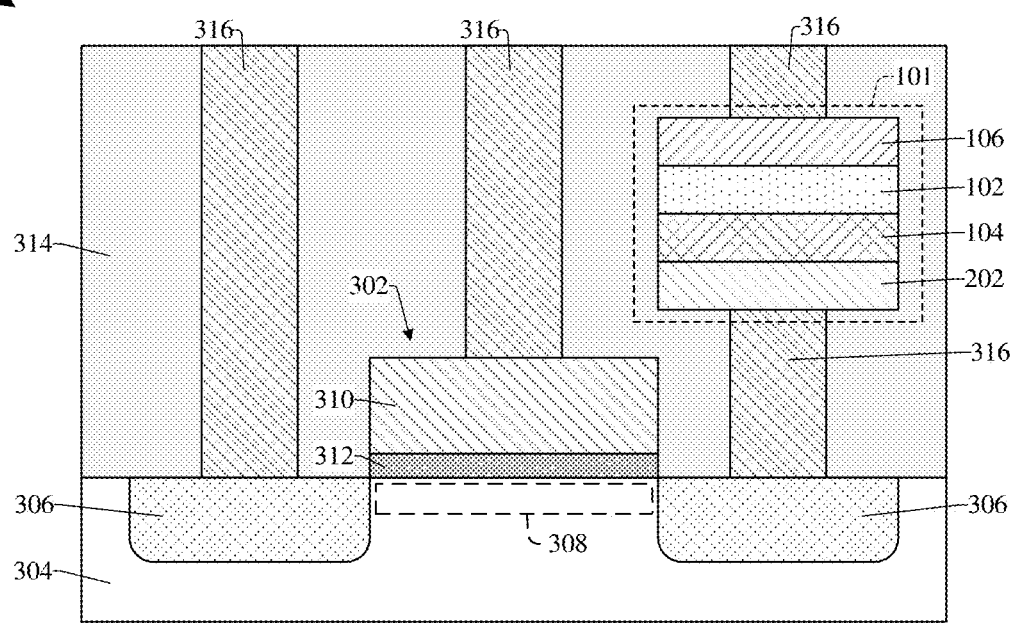

In some embodiments (e.g., as illustrated in FIG. 3B), the ferroelectric structure 101 includes a ferroelectric layer 102, a first relaxation layer 104, a second relaxation layer 106, and an outer layer 202 below the first relaxation layer 104. In some such embodiments, the first relaxation layer 104 comprises a metal, a dielectric, a ferroelectric, or an anti-ferroelectric having a substantially low Young's modulus and/or a lattice constant that is substantially different from that of the ferroelectric layer 102. In some such embodiments, the second relaxation layer 106 comprises a metal having a substantially low Young's modulus and/or a lattice constant that is substantially different from that of the ferroelectric layer 102.

Figure 3C:
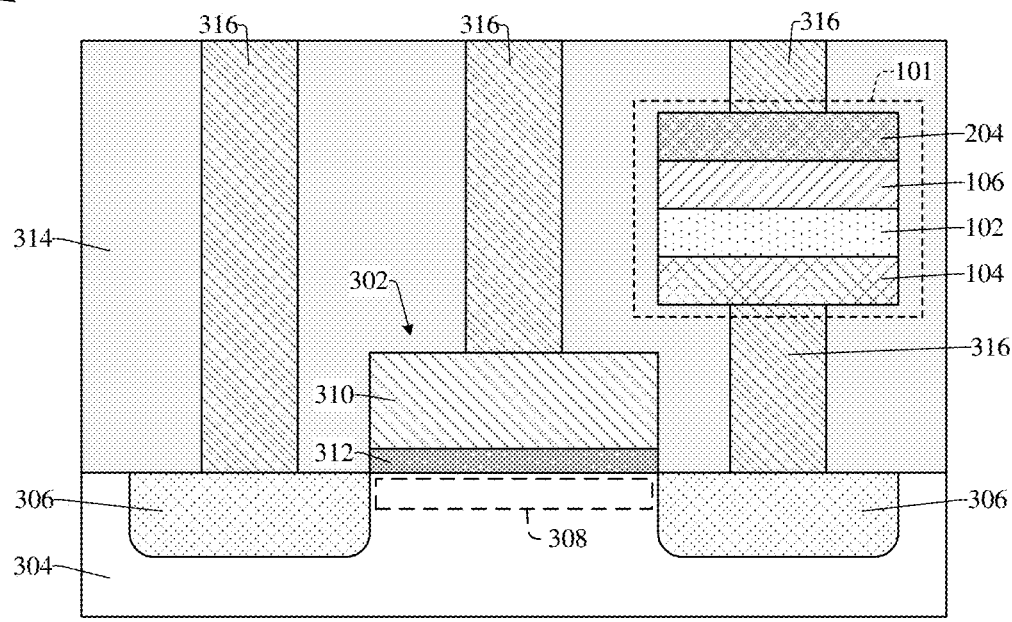

In some embodiments (e.g., as illustrated in FIG. 3C), the ferroelectric structure 101 includes a ferroelectric layer 102, a first relaxation layer 104, a second relaxation layer 106, and an outer layer 204 above the second relaxation layer 106. In some such embodiments, the first relaxation layer 104 comprises a metal having a substantially low Young's modulus and/or a lattice constant that is substantially different from that of the ferroelectric layer 102. In some such embodiments, the second relaxation layer 106 comprises a metal, a dielectric, a ferroelectric, or an anti-ferroelectric having a substantially low Young's modulus and/or a lattice constant that is substantially different from that of the ferroelectric layer 102.

Figure 3D:
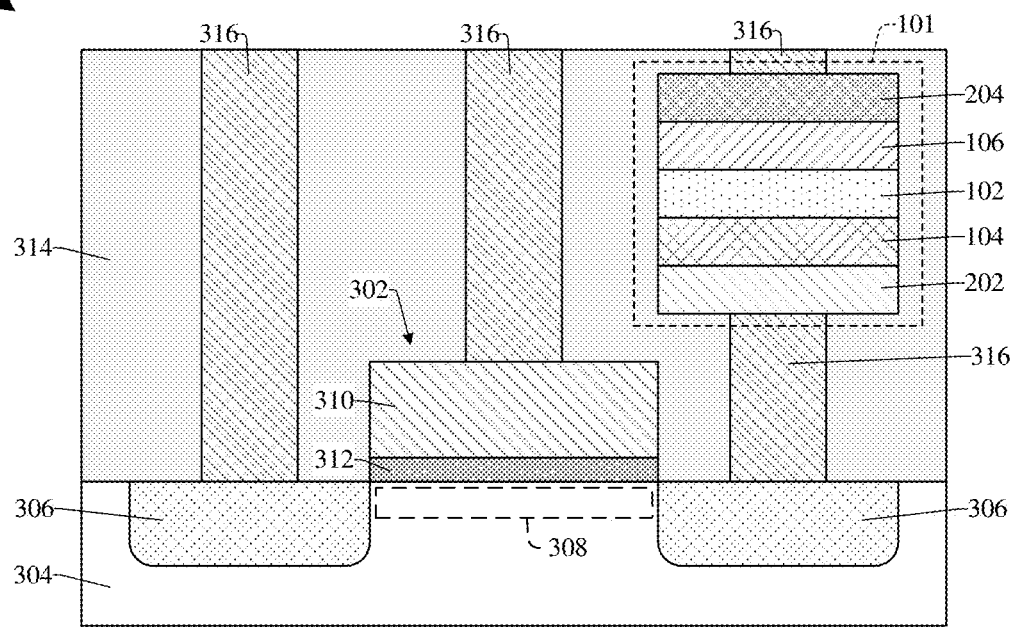

In some embodiments (e.g., as illustrated in FIG. 3D), the ferroelectric structure 101 includes a ferroelectric layer 102, a first relaxation layer 104, a second relaxation layer 106, a first outer layer 202 below the first relaxation layer 104, and a second outer layer 204 above the second relaxation layer 106. In some such embodiments, the first relaxation layer 104 comprises a metal, a dielectric, a ferroelectric, or an anti-ferroelectric having a substantially low Young's modulus and/or a lattice constant that is substantially different from that of the ferroelectric layer 102. In some such embodiments, the second relaxation layer 106 comprises a metal, a dielectric, a ferroelectric, or an anti-ferroelectric having a substantially low Young's modulus and/or a lattice constant that is substantially different from that of the ferroelectric layer 102.

In some embodiments, the outer layers 202, 204 comprise a metal such as, for example, copper, cobalt, tungsten, aluminum, titanium, tantalum, ruthenium, or some other suitable material. In some embodiments, the substrate 304 comprises a semiconductor material. In some embodiments, the source/drains 306 are doped regions of the substrate 304. In some embodiments, the substrate 304 forms the channel 308. In some embodiments, the gate electrode 310 may, for example, comprise polysilicon, metal, or some other suitable material. In some embodiments, the dielectric structure 314 may include a plurality of dielectric layers. In some embodiments, the contacts 316 comprise a conductive material such as, for example, tungsten, copper, or some other suitable material.

FIGS. 4A-4F illustrate cross-sectional views 400a-400f of some other embodiments of a memory cell including a ferroelectric structure 101.

The memory cell includes a transistor device 402 along a substrate 404. The transistor device 402 includes a pair of source/drains 406 along the substrate 404 and a channel 408 extending between the pair of source/drains 406. The ferroelectric structure 101 over is the substrate 404 between the pair of source/drains 406. A dielectric structure 410 is over the substrate 404. Contacts 412 are within the dielectric structure 410 and extend through the dielectric structure 410 to the source/drains 406 and the ferroelectric structure 101.

Figure 4A:
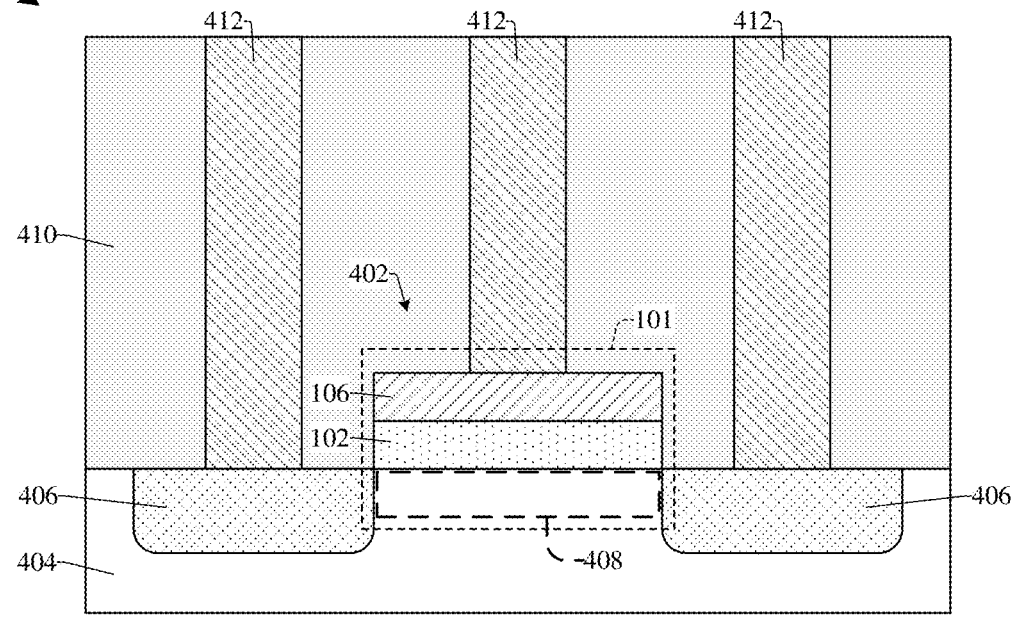
FIGS. 4A-4F illustrate cross-sectional views of some other embodiments of a memory cell including a ferroelectric structure.

In some embodiments (e.g., as illustrated in FIG. 4A), the ferroelectric structure 101 includes a ferroelectric layer 102 and a second relaxation layer 106. Further, the substrate 404 forms a first relaxation layer (e.g., 104 of FIG. 1). In some such embodiments, the substrate 404 comprises a semiconductor material having a substantially low Young's modulus and/or a lattice constant that is substantially different from that of the ferroelectric layer 102. In some such embodiments, the second relaxation layer 106 comprises a metal having a substantially low Young's modulus and/or a lattice constant that is substantially different from that of the ferroelectric layer 102. Further, in such embodiments, the second relaxation layer 106 forms a gate electrode of the transistor device 402.

Figure 4B:
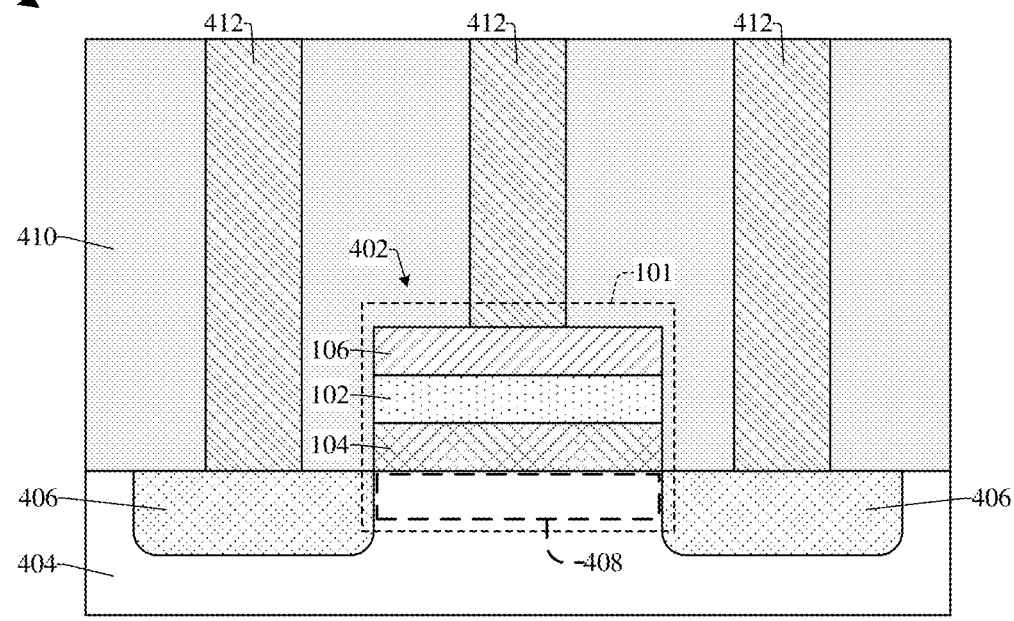

In some embodiments (e.g., as illustrated in FIG. 4B), the ferroelectric structure 101 includes a ferroelectric layer 102, a first relaxation layer 104 between the ferroelectric layer 102 and the substrate 404, and a second relaxation layer 106. In such embodiments, the substrate 404 forms an outer layer (e.g., 202 of FIG. 2) of the ferroelectric structure 101. In some such embodiments, the first relaxation layer 104 may comprise a dielectric, a ferroelectric, or an anti-ferroelectric having a substantially low Young's modulus and/or a lattice constant that is substantially different from that of the ferroelectric layer 102.

Figure 4C:
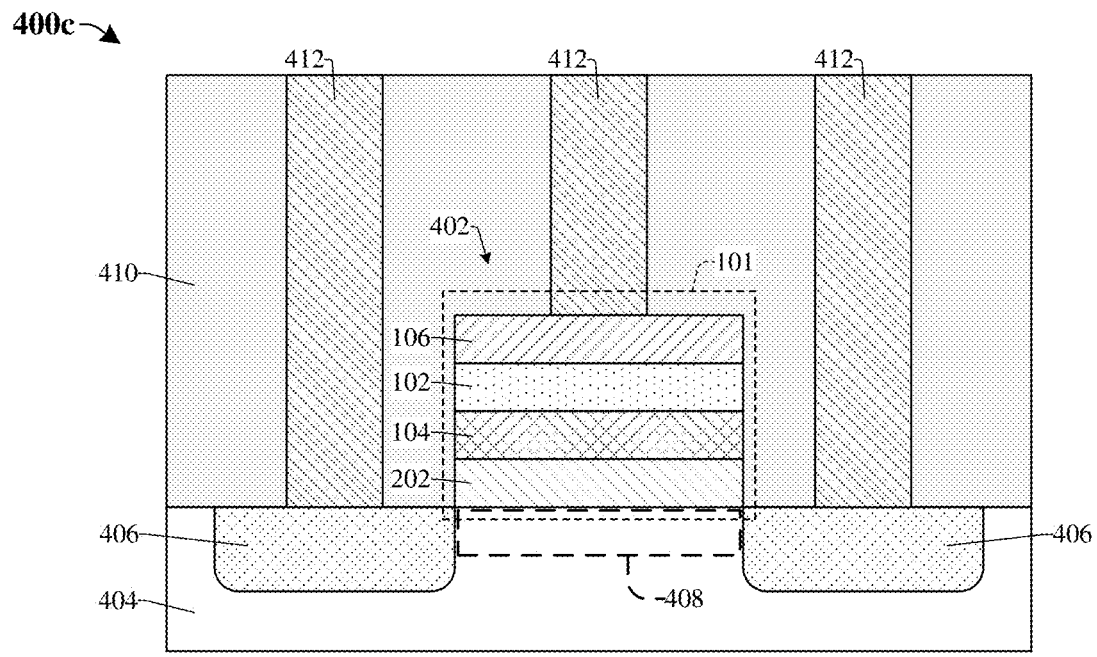

In some embodiments (e.g., as illustrated in FIG. 4C), the ferroelectric structure 101 includes a ferroelectric layer 102, a first relaxation layer 104, a second relaxation layer 106, and an outer layer 202 between the first relaxation layer 104 and the substrate 404. In some such embodiments, the outer layer 202 comprises a dielectric material.

Figure 4D:
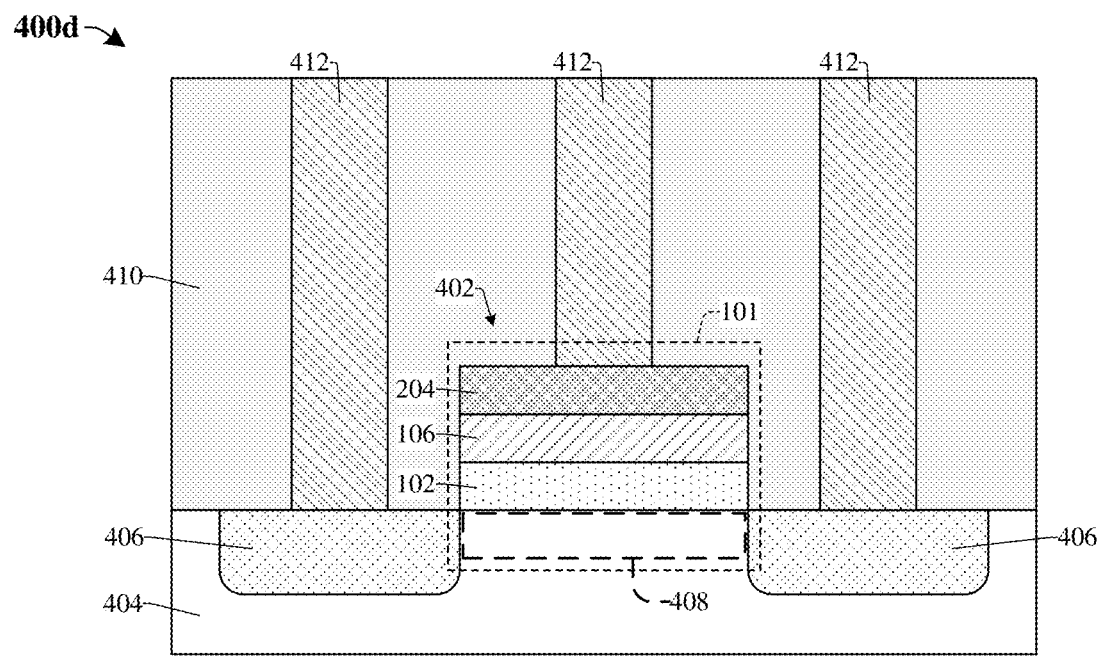

In some embodiments (e.g., as illustrated in FIG. 4D), the ferroelectric structure 101 includes a ferroelectric layer 102, a second relaxation layer 106, and an outer layer 204. Further, the substrate 404 forms a first relaxation layer (e.g., 104 of FIG. 1). In such embodiments, the outer layer 204 comprises a metal and forms a gate electrode of the transistor device 402. In such some embodiments, the second relaxation layer 106 may comprise a metal, a dielectric, a ferroelectric, or an anti-ferroelectric having a substantially low Young's modulus and/or a lattice constant that is substantially different from that of the ferroelectric layer 102.

Figure 4E:
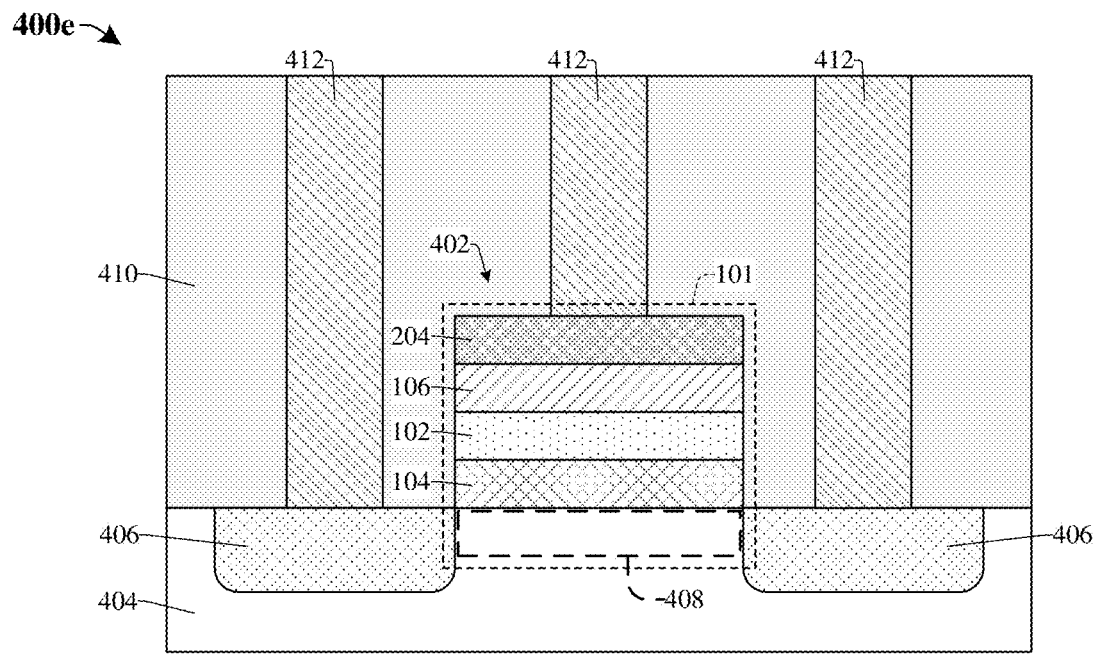

In some embodiments (e.g., as illustrated in FIG. 4E), the ferroelectric structure 101 includes a ferroelectric layer 102, a first relaxation layer 104, a second relaxation layer 106, and a second outer layer 204. Further, in such embodiments, the substrate 404 forms a first outer layer (e.g., 202 of FIG. 2).

Figure 4F:
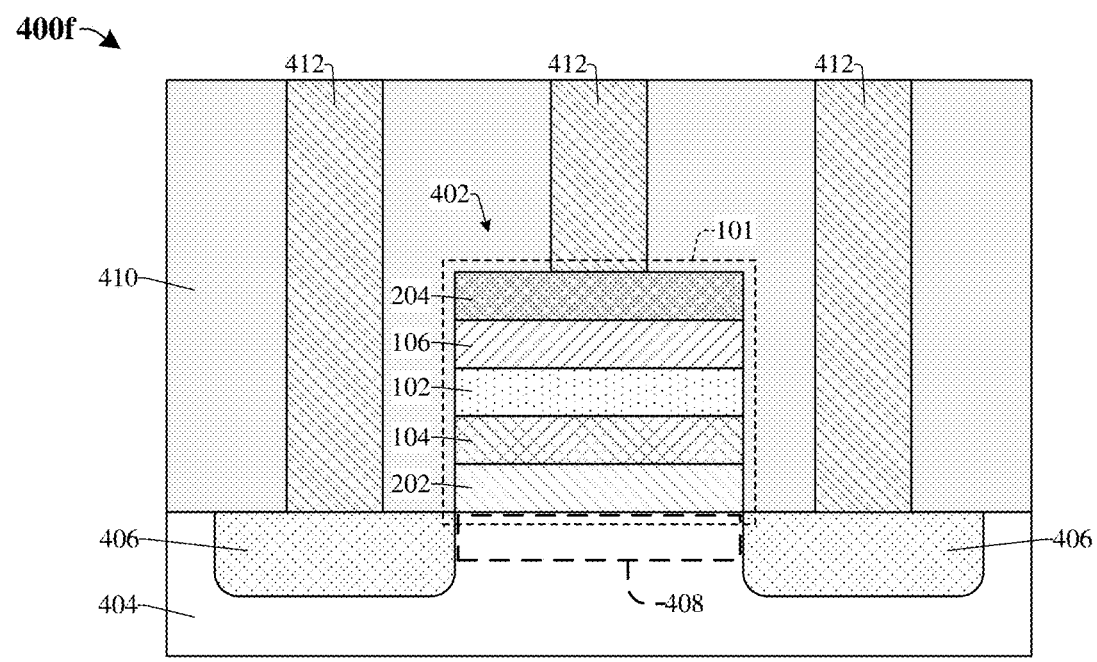

In some embodiments (e.g., as illustrated in FIG. 4F), the ferroelectric structure 101 includes a ferroelectric layer 102, a first relaxation layer 104, a second relaxation layer 106, a first outer layer 202, and a second outer layer 204. In some such embodiments, the first outer layer 202 comprises a dielectric material.

FIGS. 5A-5F illustrate cross-sectional views 500a-500f of some other embodiments of a memory cell including a ferroelectric structure 101.

The memory cell includes a transistor device 512 along a substrate 502. An insulator layer 504 is on the substrate 502 and the transistor device 512 is over the insulator layer 504. The transistor device 512 includes a pair of source/drains 506 over the substrate 502 and a channel 514 extending between the pair of source/drains 506. A dielectric layer 508 extends laterally between the pair of source/drains 506. The ferroelectric structure 101 is disposed vertically between the substrate 502 and the pair of source/drains 506.

Figure 5A:
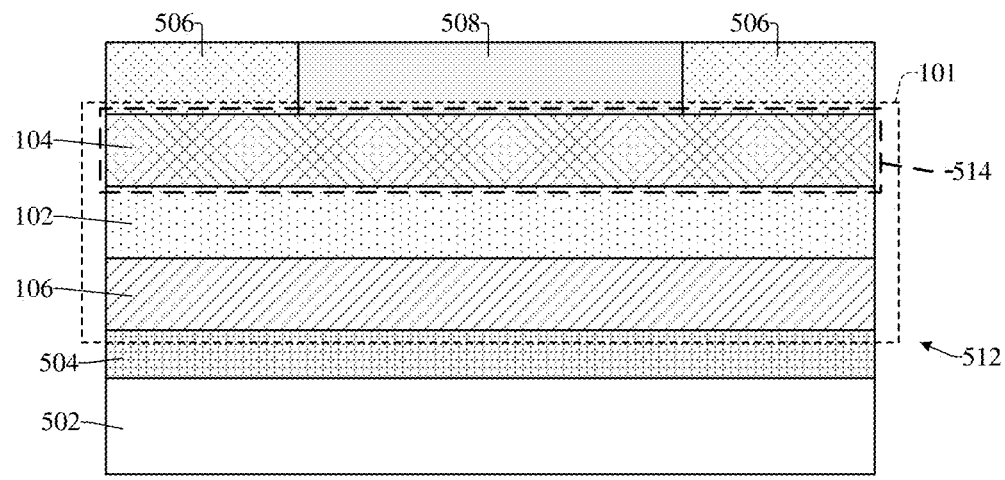
FIGS. 5A-5F illustrate cross-sectional views of some other embodiments of a memory cell including a ferroelectric structure.

In some embodiments (e.g., as illustrated in FIG. 5A), the ferroelectric structure 101 includes a ferroelectric layer 102, a first relaxation layer 104, and a second relaxation layer 106. The first relaxation layer 104 forms the channel 514. Further, the second relaxation layer 106 forms a gate electrode of the transistor device 512. In such embodiments, the first relaxation layer 104 comprises a semiconductor having a substantially low Young's modulus and/or a lattice constant that is substantially different from that of the ferroelectric layer 102. Further, in some such embodiments, the second relaxation layer 106 comprises a metal having a substantially low Young's modulus and/or a lattice constant that is substantially different from that of the ferroelectric layer 102.

Figure 5B:
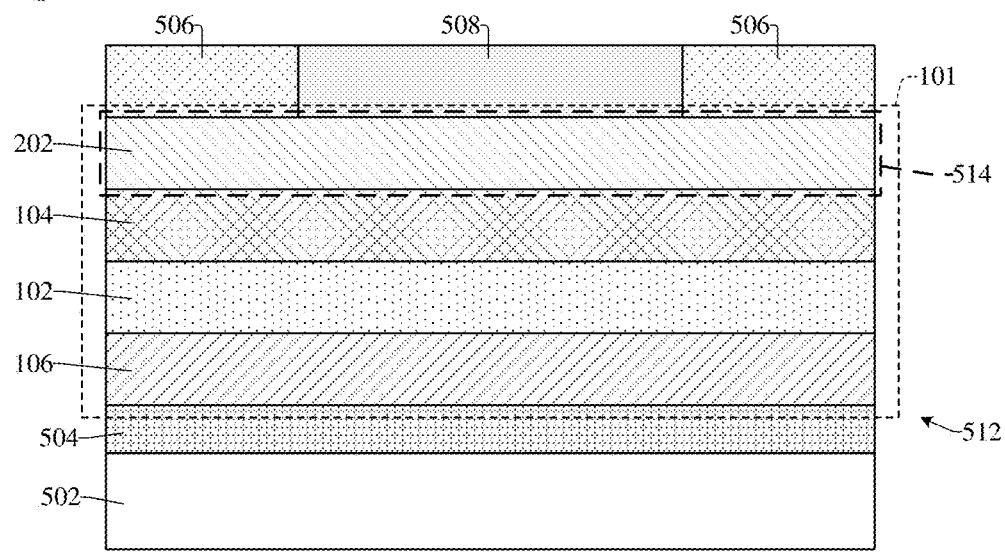

In some embodiments (e.g., as illustrated in FIG. 5B), the ferroelectric structure 101 includes a ferroelectric layer 102, a first relaxation layer 104, a second relaxation layer 106, and an outer layer 202. In such embodiments, the outer layer 202 comprises a semiconductor and forms the channel 514. In some such embodiments, the first relaxation layer 104 may comprise a dielectric, a ferroelectric, or an anti-ferroelectric having a substantially low Young's modulus and/or a lattice constant that is substantially different from that of the ferroelectric layer 102.

Figure 5C:
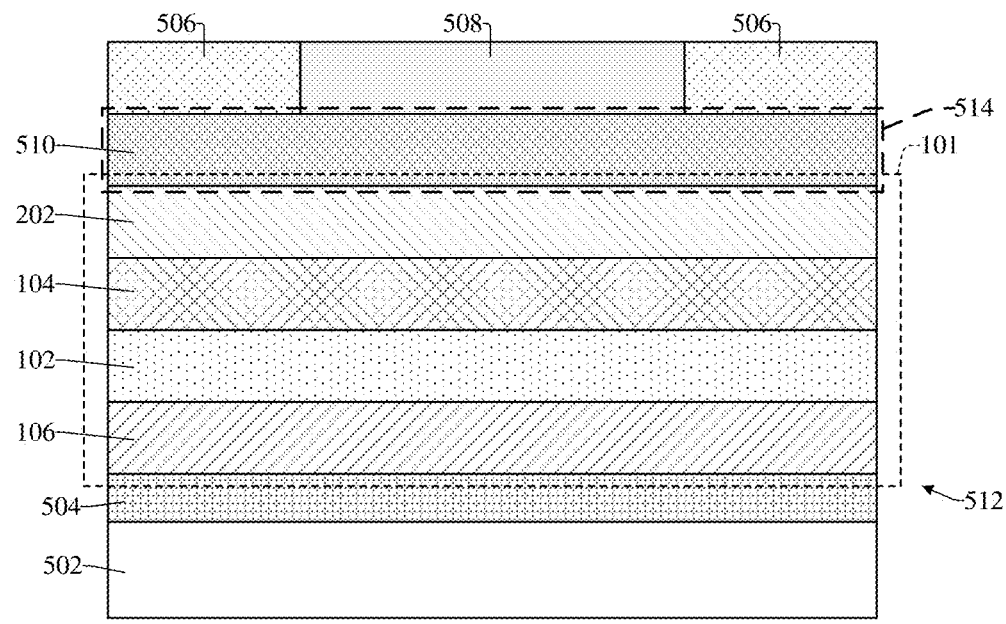

In some embodiments (e.g., as illustrated in FIG. 5C), the ferroelectric structure 101 includes a ferroelectric layer 102, a first relaxation layer 104, a second relaxation layer 106, and an outer layer 202. In addition, the transistor device 512 further includes a channel layer 510. In such embodiments, the channel layer 510 comprises a semiconductor and forms the channel 514. In some such embodiments, the outer layer 202 comprises a dielectric material.

Figure 5D:
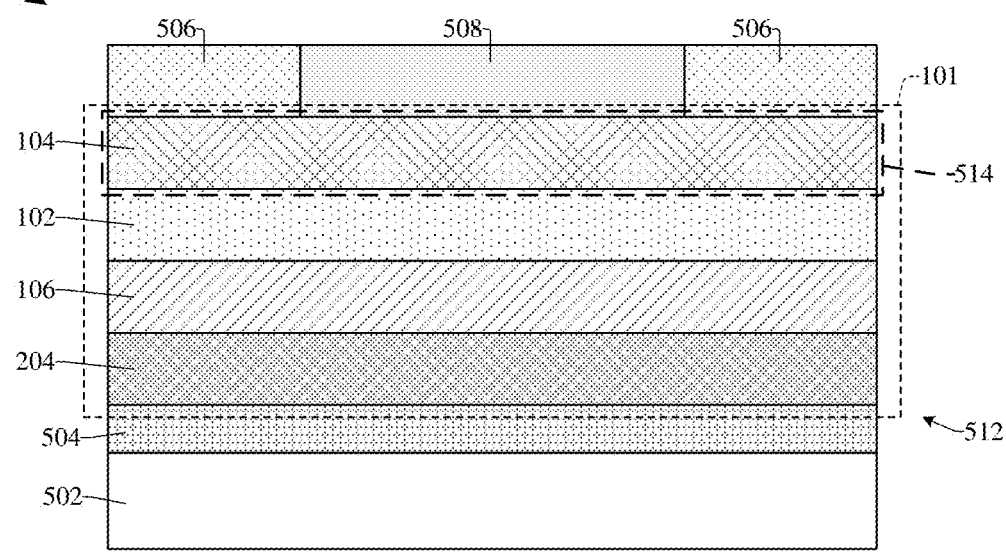

In some embodiments (e.g., as illustrated in FIG. 5D), the ferroelectric structure 101 includes a ferroelectric layer 102, a first relaxation layer 104, a second relaxation layer 106, and an outer layer 204. In such embodiments, the first relaxation layer 104 forms the channel 514 and comprises a semiconductor having a substantially low Young's modulus and/or a lattice constant that is substantially different from that of the ferroelectric layer 102. Further, the outer layer 204 comprises a metal and forms a gate electrode of the transistor device 512. In some such embodiments, the second relaxation layer 106 comprises a metal, a dielectric, a ferroelectric, or an anti-ferroelectric having a substantially low Young's modulus and/or a lattice constant that is substantially different from that of the ferroelectric layer 102.

Figure 5E:
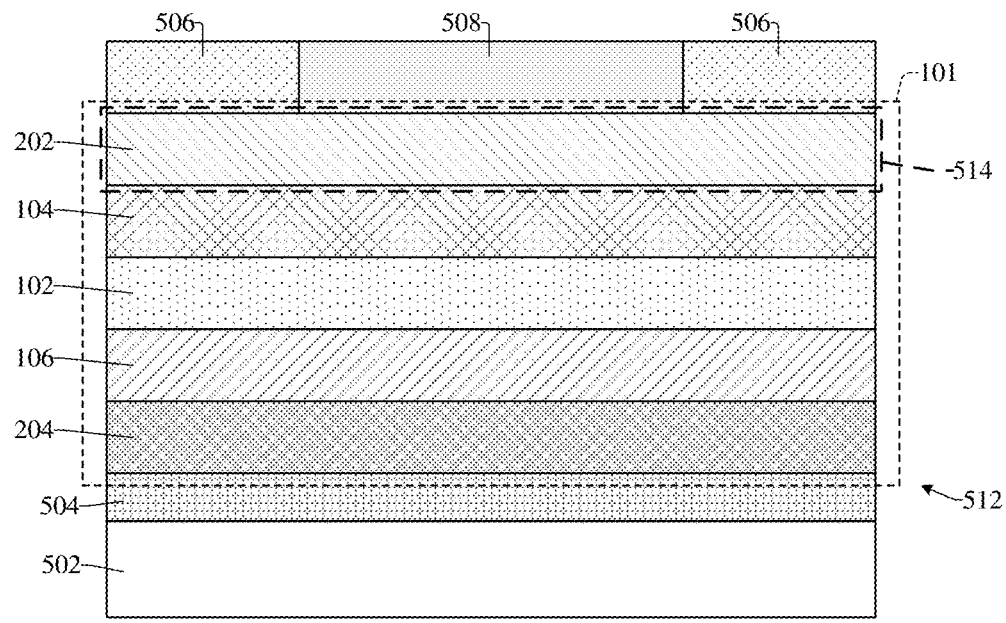

In some embodiments (e.g., as illustrated in FIG. 5E), the ferroelectric structure 101 includes a ferroelectric layer 102, a first relaxation layer 104, a second relaxation layer 106, a first outer layer 202, and a second outer layer 204. In such embodiments, the first outer layer 202 comprises a semiconductor and forms the channel 514 while the second outer layer 204 comprises a metal and forms a gate electrode of the transistor device 512.

Figure 5F:
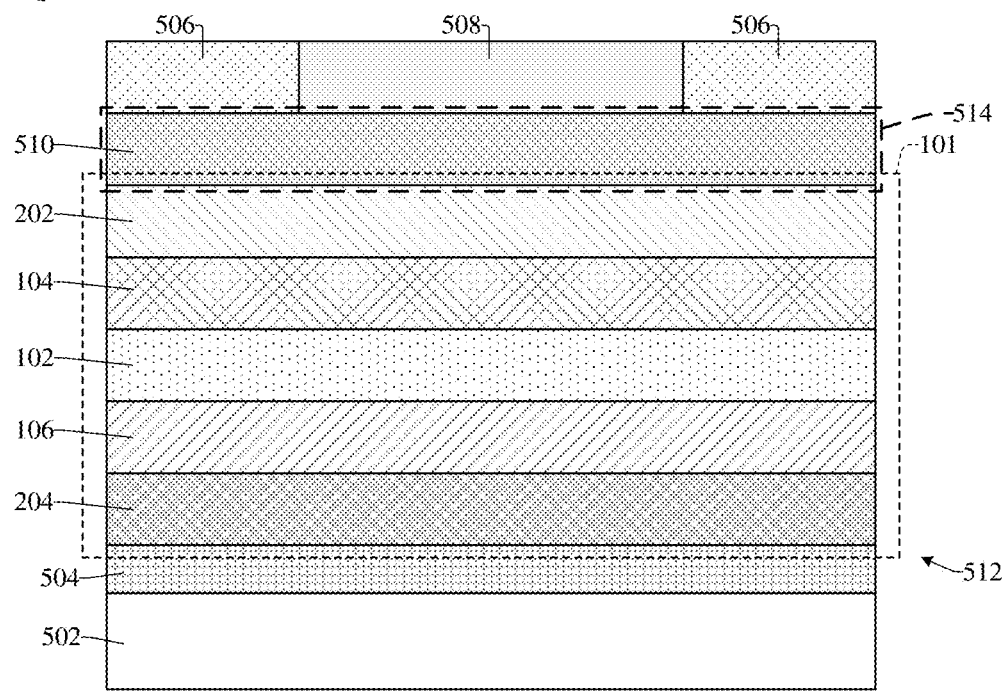

In some embodiments (e.g., as illustrated in FIG. 5F), the ferroelectric structure 101 includes a ferroelectric layer 102, a first relaxation layer 104, a second relaxation layer 106, and an outer layer 202. Further, the transistor device 512 includes a channel layer 510. In such embodiments, the channel layer 510 comprises a semiconductor material and forms the channel 514. In some such embodiments, the first outer layer 202 comprises a dielectric material while the second outer layer 204 comprises a metal and forms a gate electrode of the transistor device 512.

In some embodiments, the source/drains 506 comprise a metal or some other conductive material. In some embodiments, the dielectric layer 508 comprises silicon dioxide, silicon nitride, or some other suitable material. In some embodiments, the insulator layer 504 comprises silicon dioxide, silicon nitride, or some other suitable material.

FIGS. 6-12 illustrate cross-sectional views 600-1200 of some embodiments of a method for forming a memory cell including a ferroelectric structure 101. Although FIGS. 6-12 are described in relation to a method, it will be appreciated that the structures disclosed in FIGS. 6-12 are not limited to such a method, but instead may stand alone as structures independent of the method.

Figure 6:
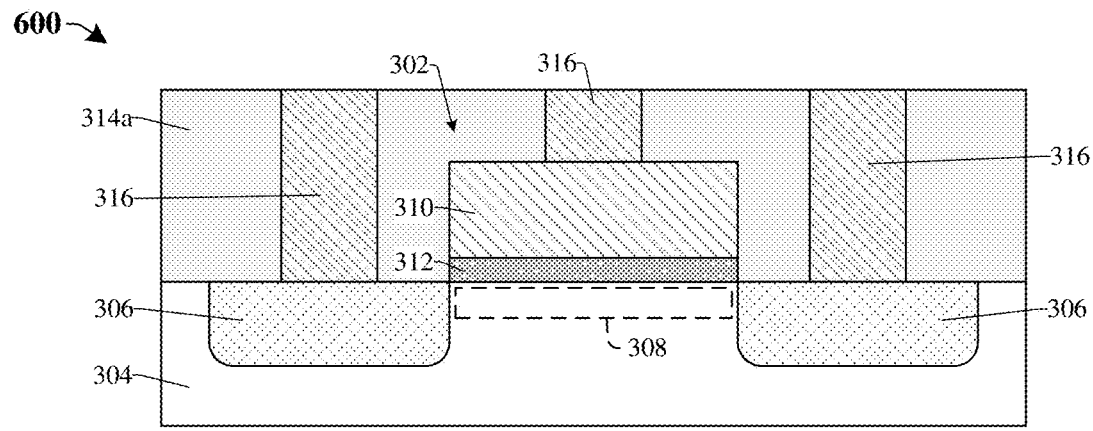
FIGS. 6-12 illustrate cross-sectional views of some embodiments of a method for forming a memory cell including a ferroelectric structure.

As shown in cross-sectional view 600 of FIG. 6, a transistor device 302 is formed along a substrate 304 and contacts 316 are formed over the transistor device 302. For example, a dielectric layer (not labeled) and an electrode layer (not labeled) are deposited over the substrate 304 and are subsequently patterned to form a gate dielectric layer 312 and a gate electrode 310. A pair of source/drains 306 are formed along the substrate 304 on opposite sides of the gate electrode 310 by doping the substrate 304 (e.g., by way of an ion implantation process or some other suitable process). A first dielectric layer 314a is deposited over the substrate 304. The first dielectric layer 314a is patterned to form contact openings (not shown) in the first dielectric layer 314a. A conductor is deposited over the substrate 304 to form contacts 316 in the contact openings.

Figure 7:
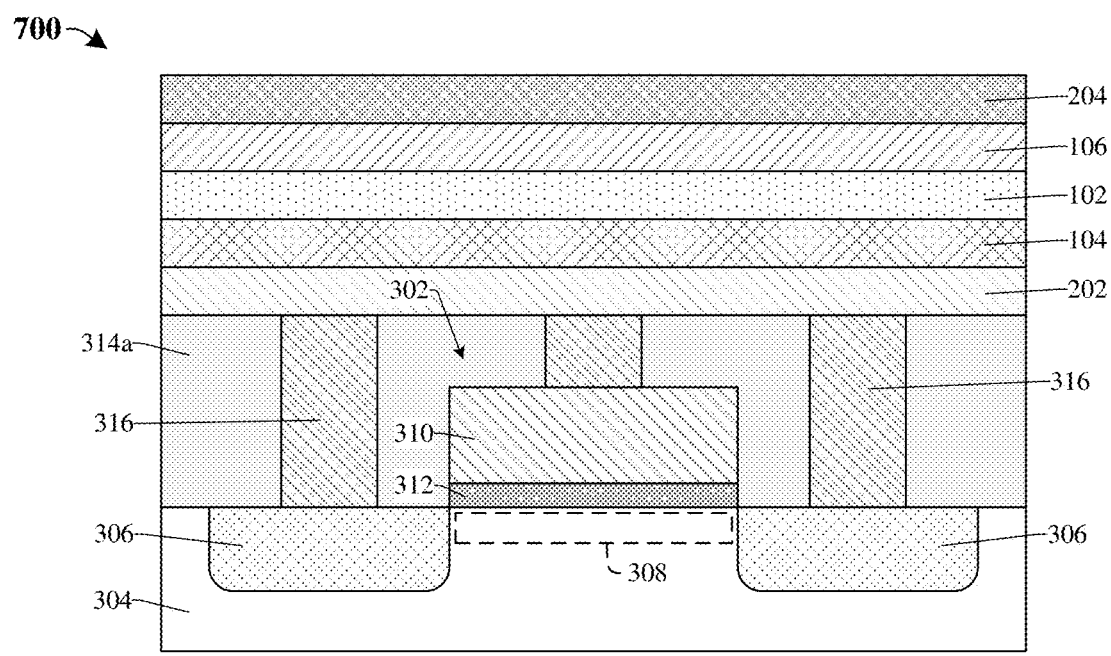

As shown in cross-sectional view 700 of FIG. 7, a plurality of layers are deposited over the substrate. In some embodiments, a first outer layer 202 is deposited over the substrate, a first relaxation layer 104 is deposited over the first outer layer 202, a ferroelectric layer 102 is deposited over the first relaxation layer 104, a second relaxation layer 106 is deposited over the ferroelectric layer 102, and a second outer layer 204 is deposited over the second relaxation layer 106.

In some embodiments, the first outer layer 202 and/or the second outer layer 204 comprise a metal and may be deposited by a chemical vapor deposition (CVD) process, a physical vapor deposition (PVD) process, an atomic layer deposition (ALD) process, a sputtering process, an electrochemical plating (ECP) process, an electrochemical deposition (ELD) process, or some other suitable process.

In some embodiments, the first relaxation layer 104 and/or the second relaxation layer 106 comprise a metal, a dielectric, a ferroelectric, an anti-ferroelectric, an amorphous material, or some other suitable material having a substantially low Young's modulus and/or a lattice constant that is substantially different from that of the ferroelectric layer 102. The first relaxation layer 104 and/or the second relaxation layer 106 may, for example, be deposited by a CVD process, a PVD process, an ALD process, a sputtering process, an ECP process, an ELD process, or some other suitable process.

In some embodiments, the ferroelectric layer 102 comprises a doped Group III (e.g., aluminum, gallium, or indium) nitride such as, for example, aluminum scandium nitride, indium scandium nitride, gallium scandium nitride, magnesium doped gallium nitride, zinc doped indium nitride, yttrium doped aluminum nitride, or some other suitable material. The ferroelectric layer 102 may, for example, be deposited by a CVD process, a PVD process, an ALD process, a sputtering process, or some other suitable process.

Figure 8:
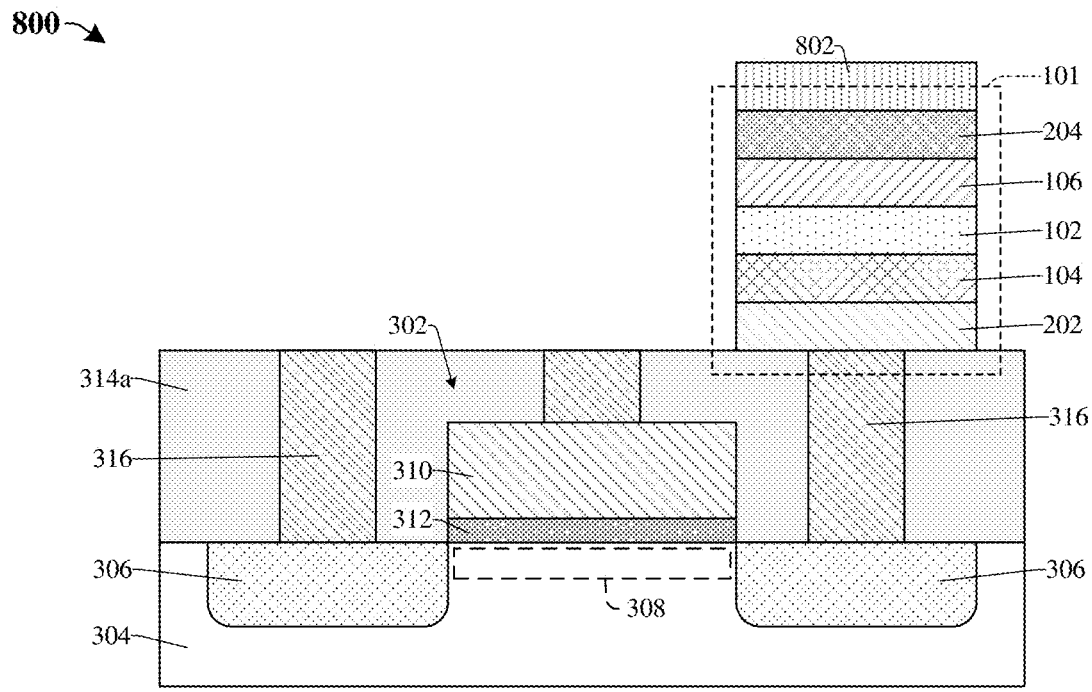

As shown in cross-sectional view 800 of FIG. 8, the first outer layer 202, the first relaxation layer 104, the ferroelectric layer 102, the second relaxation layer 106, and the second outer layer 204 are patterned. For example, a masking layer 802 is formed over the second outer layer 204 and the aforementioned layers are etched according to the masking layer 802. The patterning forms (e.g., delimits) the ferroelectric structure 101.

The masking layer 802 may, for example, comprise photoresist, some hard mask material, or some other suitable material. The etching may include a dry etching process such as, for example, a plasma etching process, a reactive ion etching process, an ion beam etching process, or some other suitable process. In some embodiments, the masking layer 802 is removed after the etching.

Figure 9:
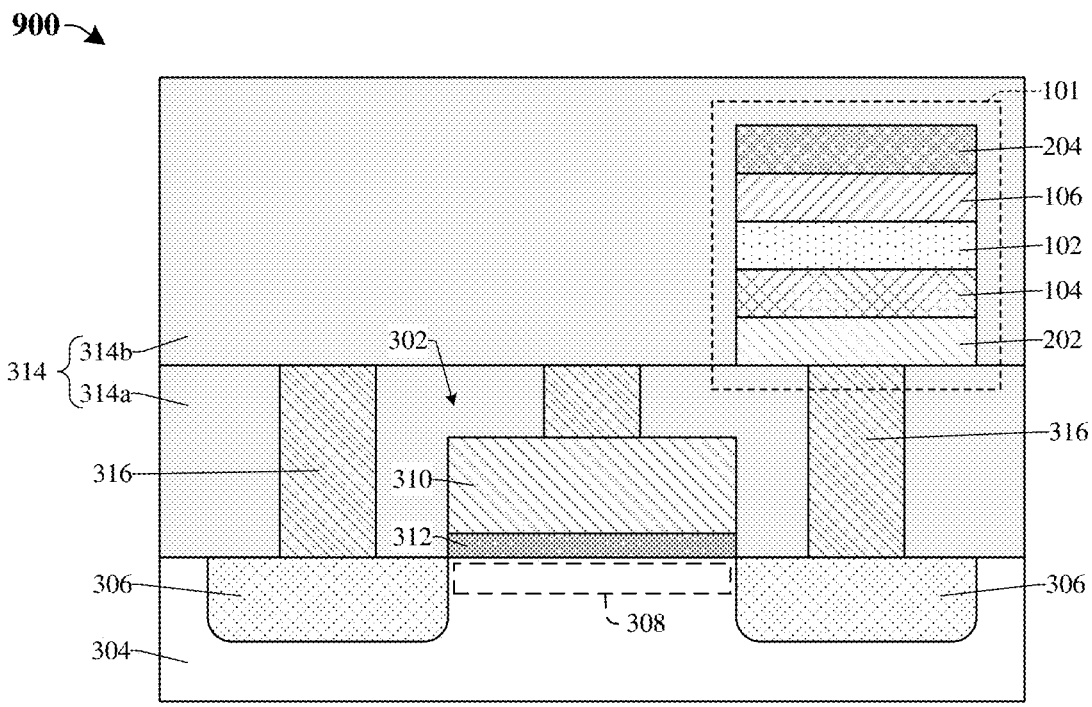

As shown in cross-sectional view 900 of FIG. 9, a second dielectric layer 314*b* is deposited over the substrate 304. The second dielectric layer 314*b* may, for example, comprise silicon dioxide, silicon nitride, or some other suitable material and may be deposited by a CVD process, a PVD process, an ALD process, or some other suitable process.

Figure 10:
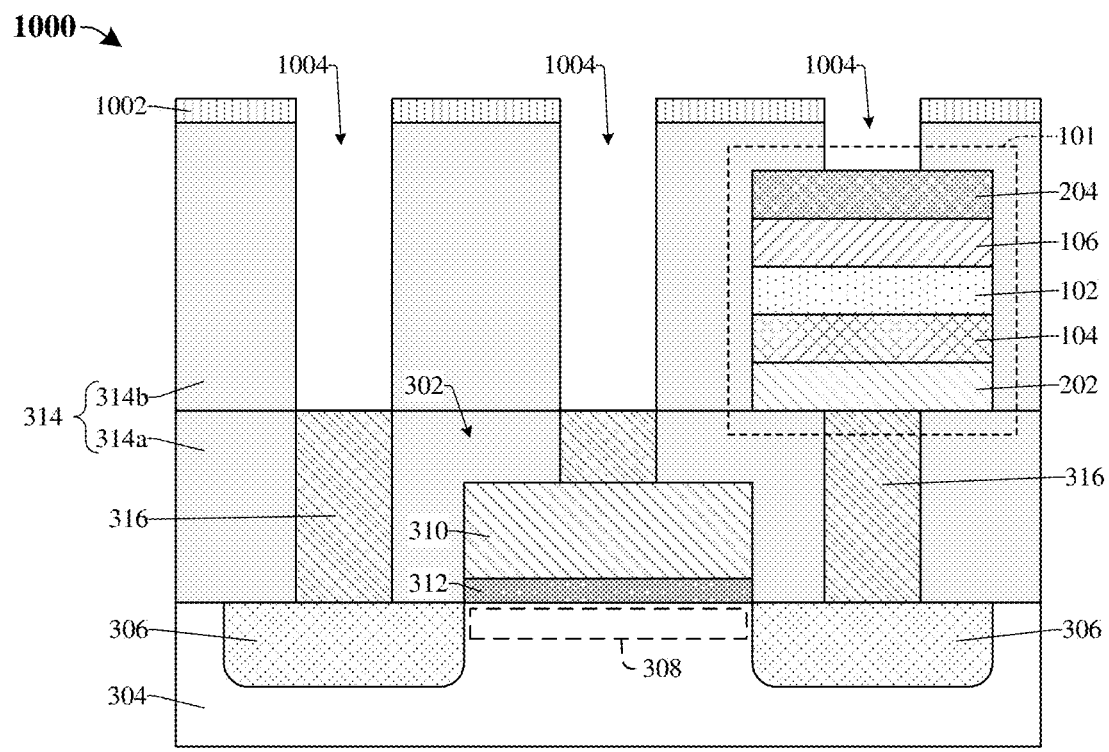

As shown in cross-sectional view 1000 of FIG. 10, the second dielectric layer 314*b* is patterned. For example, a masking layer 1002 is formed over the second dielectric layer 314*b* and the second dielectric layer 314*b* is etched according to the masking layer 1002. The patterning forms contact openings 1004 in the second dielectric layer 314*b*.

The masking layer 1002 may, for example, comprise photoresist, some hard mask material, or some other suitable material. The etching may include a dry etching process such as, for example, a plasma etching process, a reactive ion etching process, an ion beam etching process, or some other suitable process. In some embodiments, the masking layer 1002 is removed after the etching.

Figure 11:
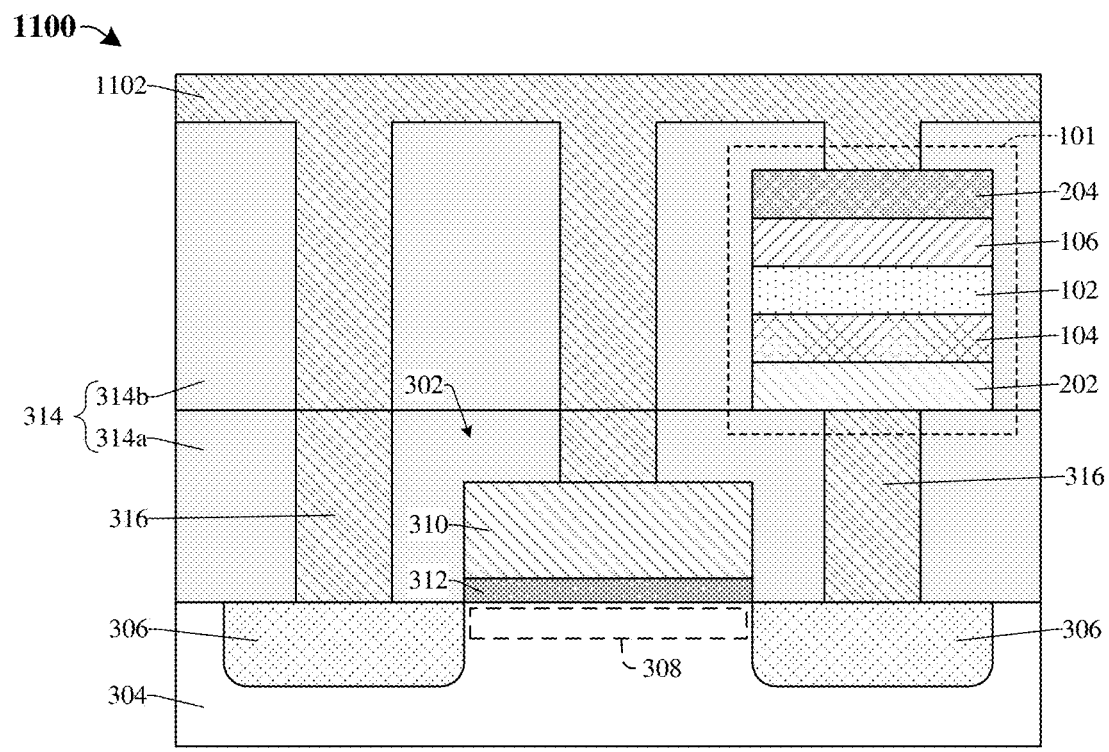

As shown in cross-sectional view 1100 of FIG. 11, a conductive layer 1102 is deposited over the substrate 304 and in the contact openings (e.g., 1004 of FIG. 10). The conductive layer 1102 may, for example, comprise tungsten, copper, or some other suitable material and may be deposited by a CVD process, a PVD process, an ALD process, a sputtering process, an ECP process, an ELD process, or some other suitable process.

Figure 12:
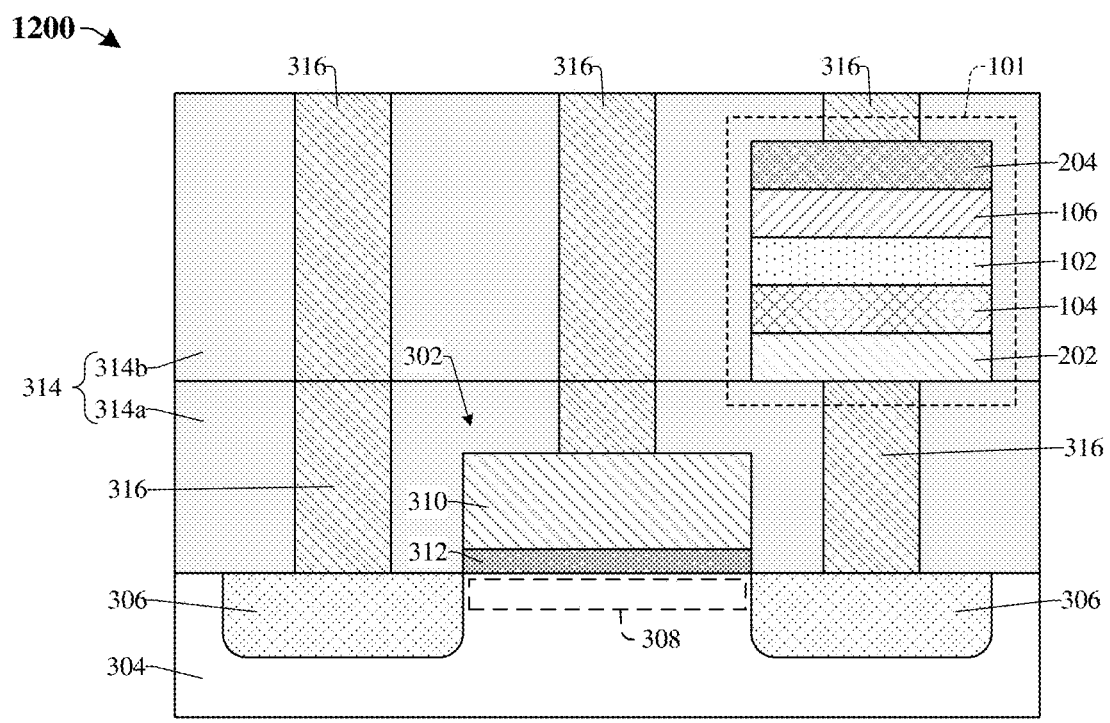

As shown in cross-sectional view 1200 of FIG. 12, a planarization process is performed on the conductive layer (e.g., 1102 of FIG. 11). The planarization process forms (e.g., delimits) contacts 316 from the conductive layer. The planarization process may also be performed on the second dielectric layer 314*b*. In some embodiments, top surfaces of the second dielectric layer 314*b* and top surfaces of the contacts 316 are coplanar as a result of the planarization process. In some embodiments, the planarization process may, for example, comprise a chemical mechanical planarization (CMP) process or some other suitable process.

Although FIGS. 6-12 illustrate a method for forming for forming a memory cell similar to that illustrated in FIG. 3D, it will be appreciated that the same or similar method may be performed to form a memory cell similar to that illustrated in any of FIGS. 3A-3D.

FIGS. 13-19 illustrate cross-sectional views 1300-1900 of some embodiments of a method for forming a memory cell including a ferroelectric structure 101. Although FIGS. 13-19 are described in relation to a method, it will be appreciated that the structures disclosed in FIGS. 13-19 are not limited to such a method, but instead may stand alone as structures independent of the method.

Figure 13:
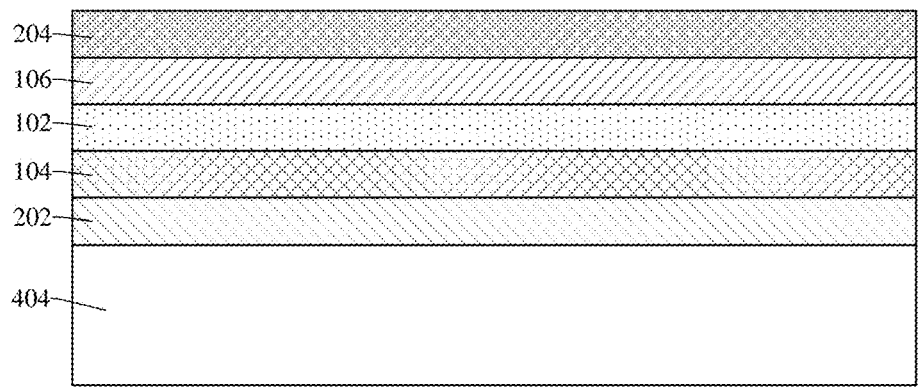
FIGS. 13-19 illustrate cross-sectional views of some other embodiments of a method for forming a memory cell including a ferroelectric structure.

As shown in cross-sectional view 1300 of FIG. 13, a plurality of layers are formed over a substrate 404. For example, in some embodiments, a first outer layer 202 is deposited over the substrate 404, a first relaxation layer 104 is deposited over the first outer layer 202, a ferroelectric layer 102 is deposited over the first relaxation layer 104, a second relaxation layer 106 is deposited over the ferroelectric layer 102, and a second outer layer 204 is deposited over the second relaxation layer 106.

In some embodiments, the first outer layer 202 comprises a dielectric and may be deposited by a CVD process, a PVD process, an ALD process, or some other suitable process. In some embodiments, the second outer layer 204 comprises a metal and may be deposited by a CVD process, a PVD process, an ALD process, a sputtering process, an ECP process, an ELD process, or some other suitable process.

In some embodiments, the first relaxation layer 104 comprises a dielectric, a ferroelectric, an anti-ferroelectric, an amorphous material, or some other suitable material having a substantially low Young's modulus and/or a lattice constant that is substantially different from that of the ferroelectric layer 102. The first relaxation layer 104 may, for example, be deposited by a CVD process, a PVD process, an ALD process, a sputtering process, or some other suitable process.

In some embodiments, the second relaxation layer 106 comprises a metal, a dielectric, a ferroelectric, an anti-ferroelectric, an amorphous material, or some other suitable material having a substantially low Young's modulus and/or a lattice constant that is substantially different from that of the ferroelectric layer 102. The second relaxation layer 106 may, for example, be deposited by a CVD process, a PVD process, an ALD process, a sputtering process, an ECP process, an ELD process, or some other suitable process.

In some embodiments, the ferroelectric layer 102 comprises a doped Group III (e.g., aluminum, gallium, or indium) nitride and may, for example, be deposited by a CVD process, a PVD process, an ALD process, a sputtering process, or some other suitable process.

Figure 14:
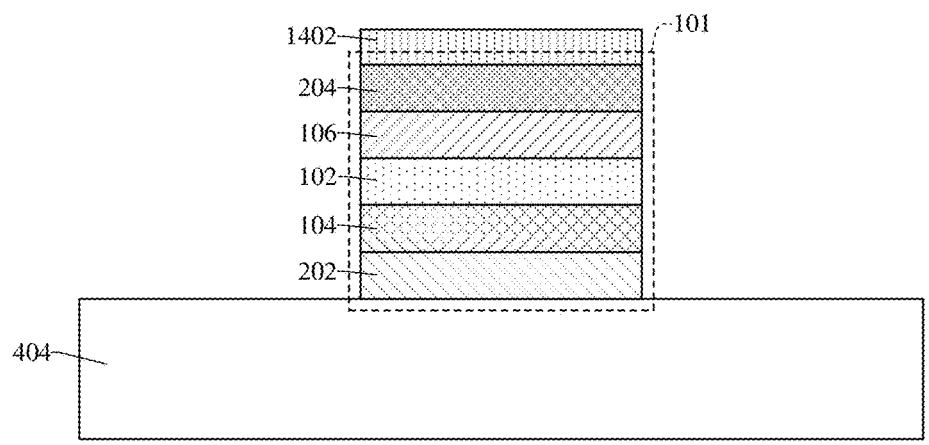

As shown in cross-sectional view 1400 of FIG. 14, the first outer layer 202, the first relaxation layer 104, the ferroelectric layer 102, the second relaxation layer 106, and the second outer layer 204 are patterned. For example, a masking layer 1402 is formed over the second outer layer 204 and the aforementioned layers are etched according to the masking layer 1402. The patterning forms (e.g., delimits) the ferroelectric structure 101.

The masking layer 1402 may, for example, comprise photoresist, some hard mask material, or some other suitable material. The etching may include a dry etching process such as, for example, a plasma etching process, a reactive ion etching process, an ion beam etching process, or some other suitable process. In some embodiments, the masking layer 1402 is removed after the etching.

Figure 15:
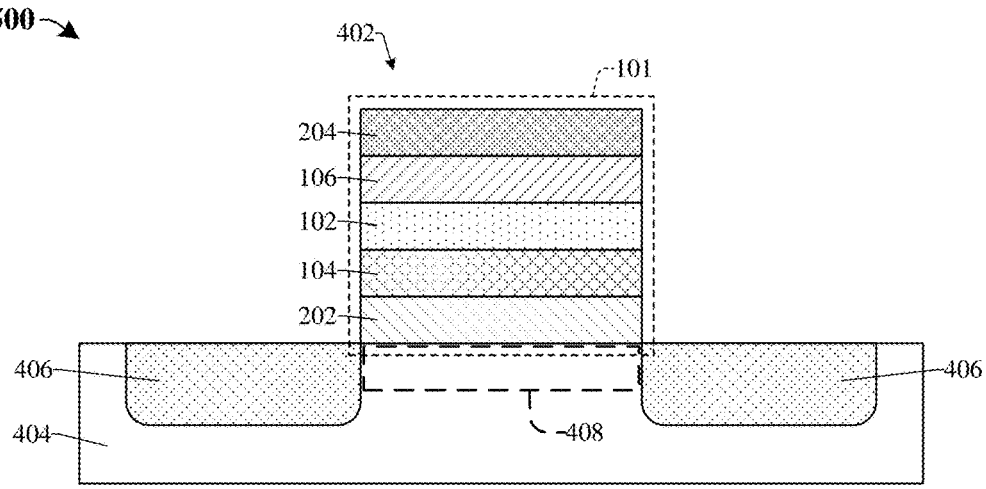

As shown in cross-sectional view 1500 of FIG. 15, a pair of source/drains 406 are formed along the substrate 404 on opposite sides of the ferroelectric structure 101. In some embodiments, the pair of source/drain structures are formed by doping the substrate 304 (e.g., by way of an ion implantation process or some other suitable process) with the ferroelectric structure 101 in place so that the source/drains 406 are self-aligned to the ferroelectric structure 101.

Figure 16:
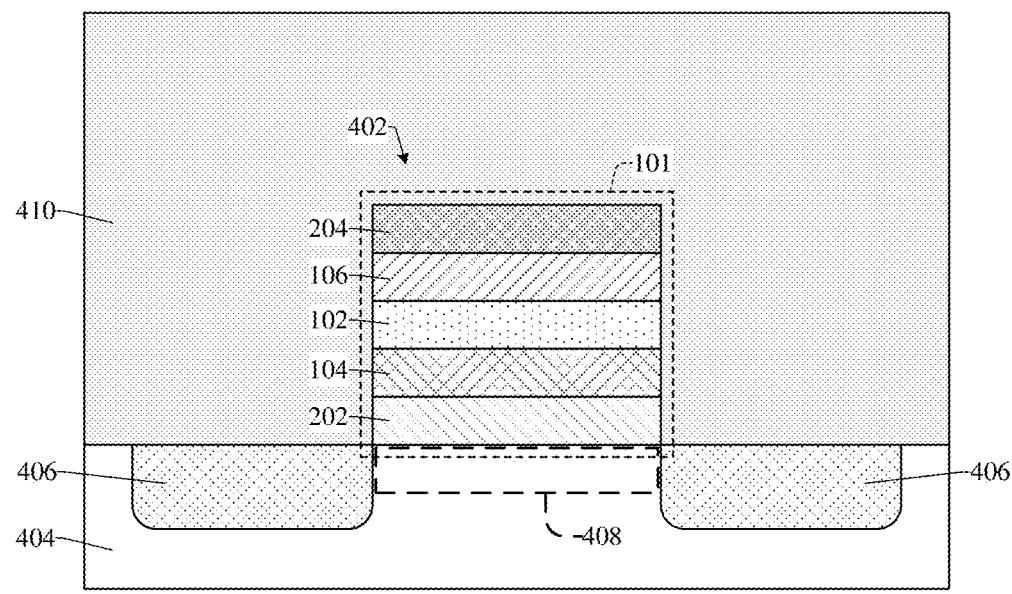

As shown in cross-sectional view 1600 of FIG. 16, a dielectric structure 410 is formed over the substrate 404. The dielectric structure 410 may be formed by depositing one or more dielectric layers over the substrate 404. For example, the one or more dielectric layers may comprise silicon dioxide, silicon nitride, or some other suitable material and may be deposited by a CVD process, a PVD process, an ALD process, or some other suitable process.

Figure 17:
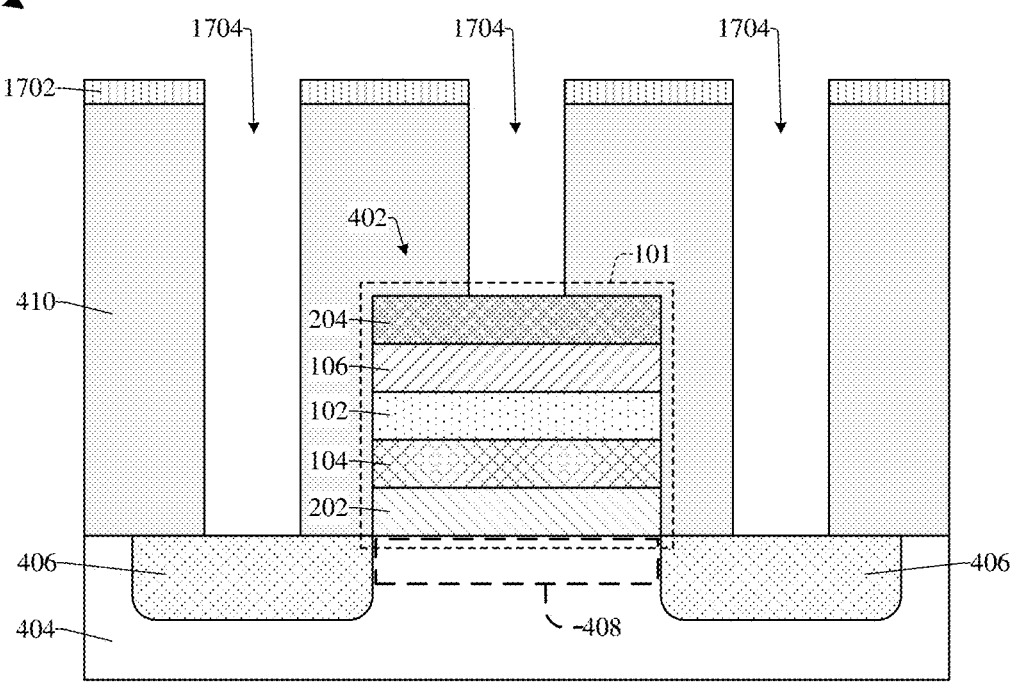

As shown in cross-sectional view 1700 of FIG. 17, the dielectric structure 410 is patterned. For example, a masking layer 1702 is formed over the dielectric structure 410 and the dielectric structure 410 is etched according to the masking layer 1702. The patterning forms contact openings 1704 in the dielectric structure 410.

The masking layer 1702 may, for example, comprise photoresist, some hard mask material, or some other suitable material. The etching may include a dry etching process such as, for example, a plasma etching process, a reactive ion etching process, an ion beam etching process, or some other suitable process. In some embodiments, the masking layer 1702 is removed after the etching.

Figure 18:
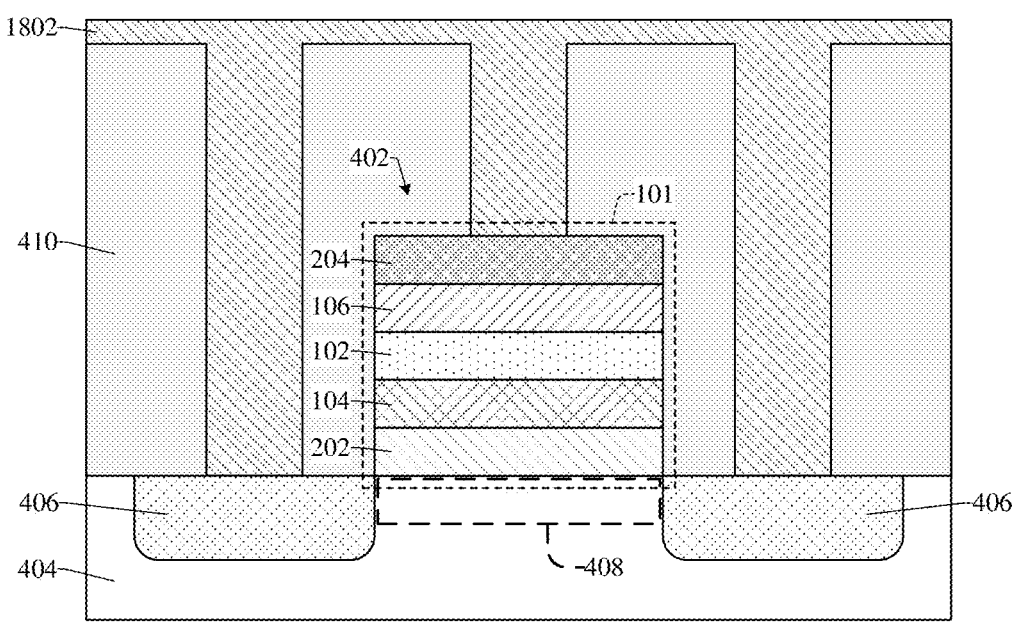

As shown in cross-sectional view 1800 of FIG. 18, a conductive layer 1802 is deposited over the substrate 404 and in the contact openings (e.g., 1704 of FIG. 17). The conductive layer 1802 may, for example, comprise tungsten, copper, or some other suitable material and may be deposited by a CVD process, a PVD process, an ALD process, a sputtering process, an ECP process, an ELD process, or some other suitable process.

Figure 19:
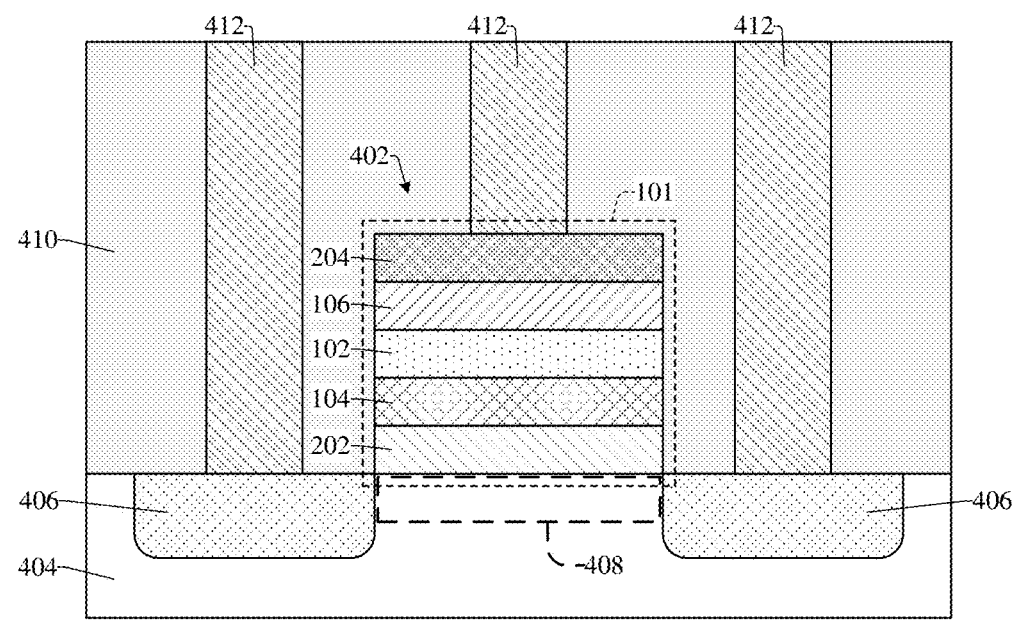

As shown in cross-sectional view 1900 of FIG. 19, a planarization process is performed on the conductive layer (e.g., 1802 of FIG. 18). The planarization process forms (e.g., delimits) contacts 412 from the conductive layer. The planarization process may also be performed on the dielectric structure 410. In some embodiments, top surfaces of the dielectric structure 410 and top surfaces of the contacts 412 are coplanar as a result of the planarization process. In some embodiments, the planarization process may, for example, comprise a CMP process or some other suitable process.

Although FIGS. 13-19 illustrate a method for forming for forming a memory cell similar to that illustrated in FIG. 4F, it will be appreciated that the same or similar method may be performed to form a memory cell similar to that illustrated in any of FIGS. 4A-4F.

FIGS. 20-24 illustrate cross-sectional views 2000-2400 of some embodiments of a method for forming a memory cell including a ferroelectric structure 101. Although FIGS. 20-24 are described in relation to a method, it will be appreciated that the structures disclosed in FIGS. 20-24 are not limited to such a method, but instead may stand alone as structures independent of the method.

Figure 20:
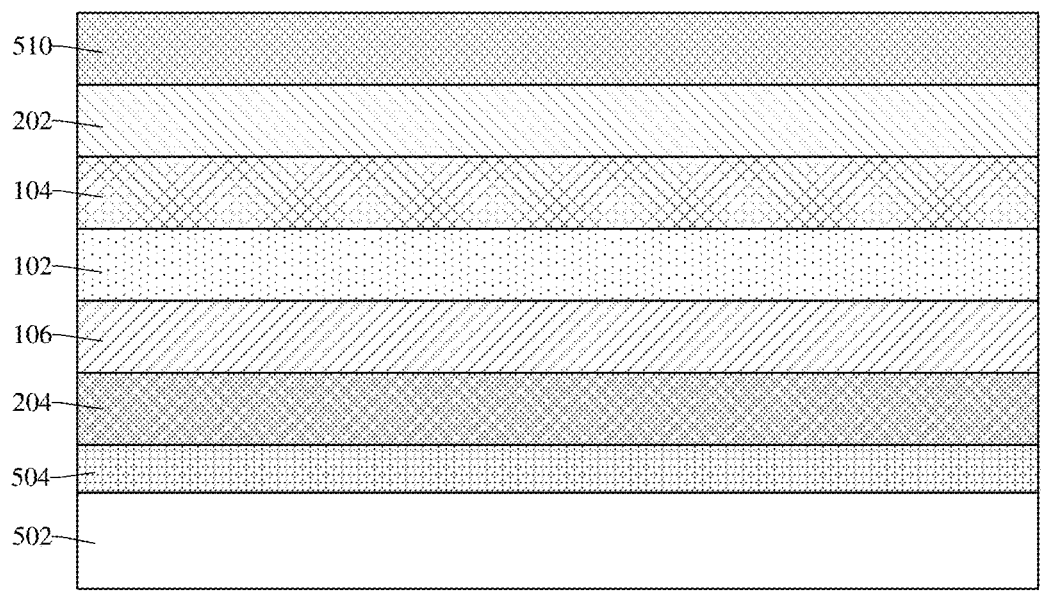
FIGS. 20-24 illustrate cross-sectional views of some other embodiments of a method for forming a memory cell including a ferroelectric structure.

As shown in cross-sectional view 2000 of FIG. 20, a plurality of layers are formed over a substrate 404. For example, in some embodiments, a second outer layer 204 is deposited over an insulator layer 504 that is over the substrate 404, a second relaxation layer 106 is deposited over the second outer layer 204, a ferroelectric layer 102 is deposited over the second relaxation layer 106, a first relaxation layer 104 is deposited over the ferroelectric layer 102, and a first outer layer 202 is deposited over the first relaxation layer 104. In some embodiments, a channel layer 510 is deposited over the first outer layer 202.

In some embodiments, the first outer layer 202 comprises a dielectric and may be deposited by a CVD process, a PVD process, an ALD process, or some other suitable process. In some embodiments, the second outer layer 204 comprises a metal and may be deposited by a CVD process, a PVD process, an ALD process, a sputtering process, an ECP process, an ELD process, or some other suitable process. In some embodiments, the channel layer 510 comprises a semiconductor and may be deposited by a CVD process, a PVD process, an ALD process, an epitaxial growth process, or some other suitable process.

In some embodiments, the first relaxation layer 104 comprises a dielectric, a ferroelectric, an anti-ferroelectric, an amorphous material, or some other suitable material having a substantially low Young's modulus and/or a lattice constant that is substantially different from that of the ferroelectric layer 102. The first relaxation layer 104 may, for example, be deposited by a CVD process, a PVD process, an ALD process, a sputtering process, or some other suitable process.

In some embodiments, the second relaxation layer 106 comprises a metal, a dielectric, a ferroelectric, an anti-ferroelectric, an amorphous material, or some other suitable material having a substantially low Young's modulus and/or a lattice constant that is substantially different from that of the ferroelectric layer 102. The second relaxation layer 106 may, for example, be deposited by a CVD process, a PVD process, an ALD process, a sputtering process, an ECP process, an ELD process, or some other suitable process.

In some embodiments, the ferroelectric layer 102 comprises a doped Group III (e.g., aluminum, gallium, or indium) nitride and may, for example, be deposited by a CVD process, a PVD process, an ALD process, a sputtering process, or some other suitable process.

Figure 21:
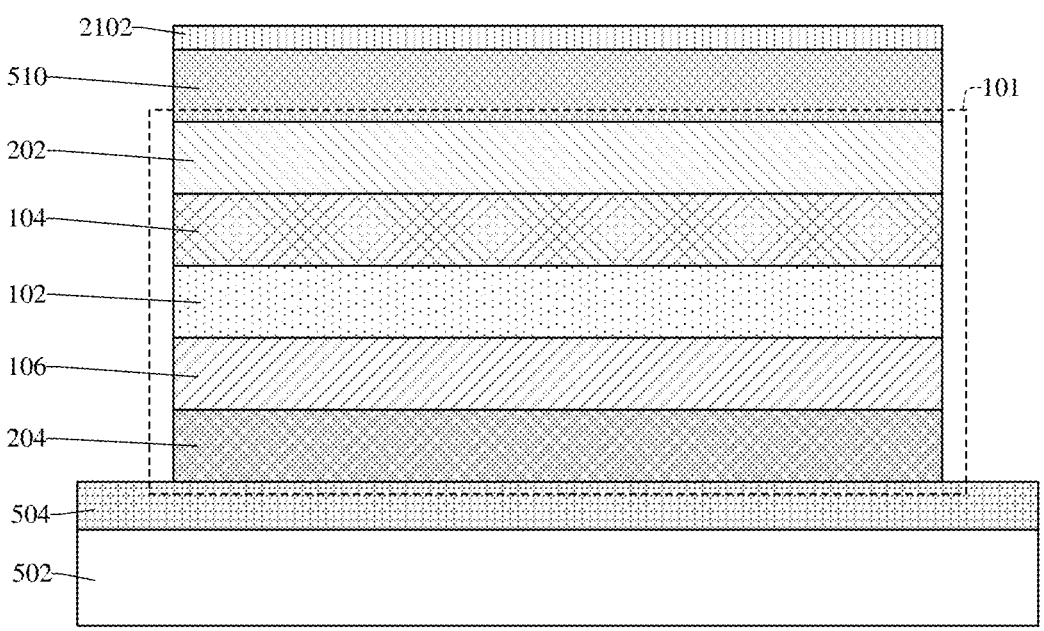

As shown in cross-sectional view 2100 of FIG. 21, the channel layer 510, the first outer layer 202, the first relaxation layer 104, the ferroelectric layer 102, the second relaxation layer 106, and the second outer layer 204 are patterned. For example, a masking layer 2102 is formed over the channel layer 510 and the aforementioned layers are etched according to the masking layer 2102. The patterning forms (e.g., delimits) the ferroelectric structure 101.

The masking layer 2102 may, for example, comprise photoresist, some hard mask material, or some other suitable material. The etching may include a dry etching process such as, for example, a plasma etching process, a reactive ion etching process, an ion beam etching process, or some other suitable process. In some embodiments, the masking layer 2102 is removed after the etching.

Figure 22:
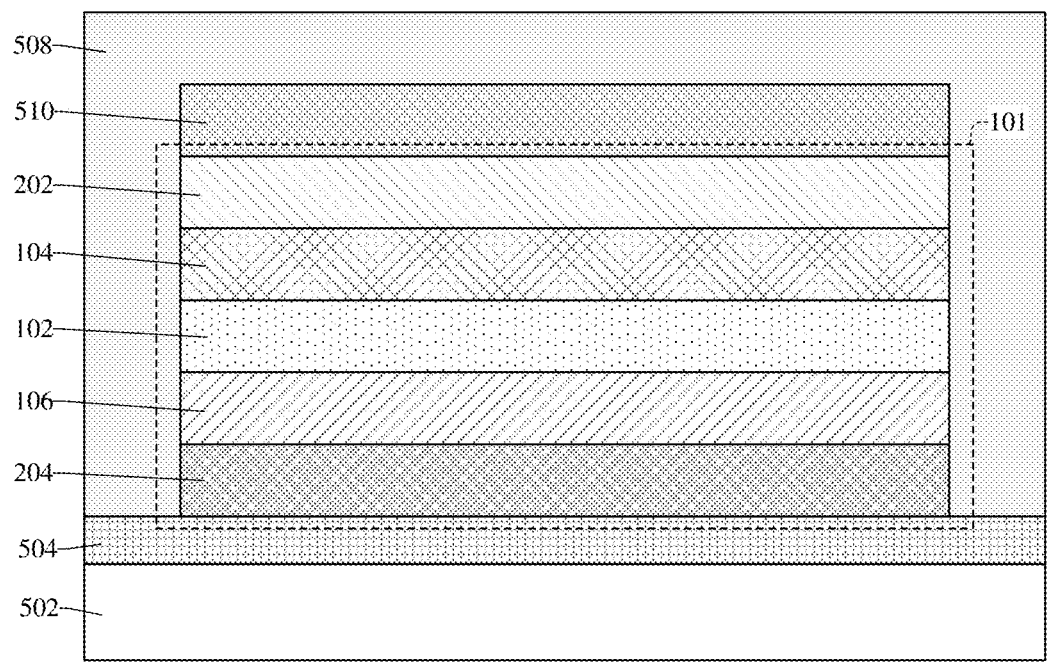

As shown in cross-sectional view 2200 of FIG. 22, a dielectric layer 508 is deposited over the substrate 502 and on opposite sides of the ferroelectric structure 101. In some embodiments, the dielectric layer 508 comprises silicon dioxide, silicon nitride, or some other suitable material and is deposited by a CVD process, a PVD process, an ALD process, or some other suitable process.

Figure 23:
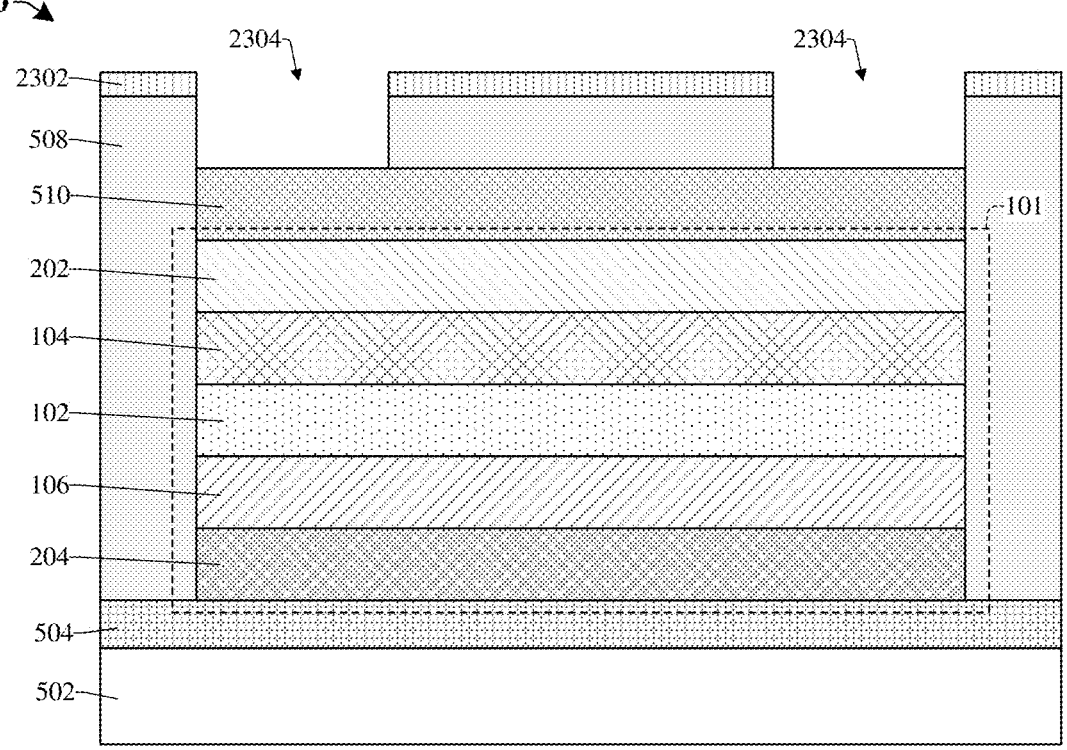

As shown in cross-sectional view 2300 of FIG. 23, the dielectric layer 508 is patterned. For example, a masking layer 2302 is formed over the dielectric layer 508 and the dielectric layer 508 is etched according to the masking layer 2302. The patterning forms source/drain openings 2304 in the dielectric layer 508 over the channel layer 510.

The masking layer 2302 may, for example, comprise photoresist, some hard mask material, or some other suitable material. The etching may include a dry etching process such as, for example, a plasma etching process, a reactive ion etching process, an ion beam etching process, or some other suitable process. In some embodiments, the masking layer 2302 is removed after the etching.

Figure 24:
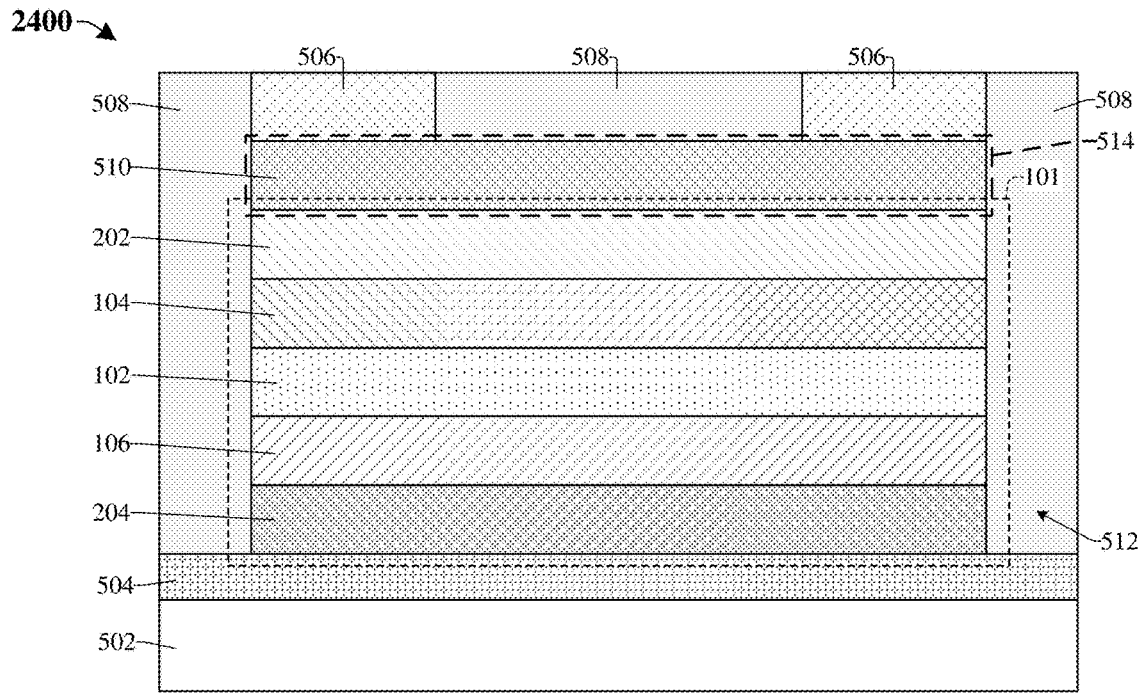

As shown in cross-sectional view 2400 of FIG. 24, a pair of source/drains 506 are formed in the source/drain openings (e.g., 2304 of FIG. 23). For example, the pair of source/drains 506 may be formed by depositing a conductive layer (e.g., comprising aluminum, titanium, tantalum, tungsten, ruthenium, gold, copper, some other suitable metal, or some other suitable material) over the substrate 502 and in the source/drain openings by way of a CVD process, a PVD process, an ALD process, a sputtering process, an ECP process, an ELD process, or some other suitable process. A planarization process (e.g., a CMP or the like) may be subsequently performed on the conductive layer to form the source/drains 506 from the conductive layer.

Although FIGS. 14-24 illustrate a method for forming for forming a memory cell similar to that illustrated in FIG. 5F, it will be appreciated that the same or similar method may be performed to form a memory cell similar to that illustrated in any of FIGS. 5A-5F.

Figure 25:
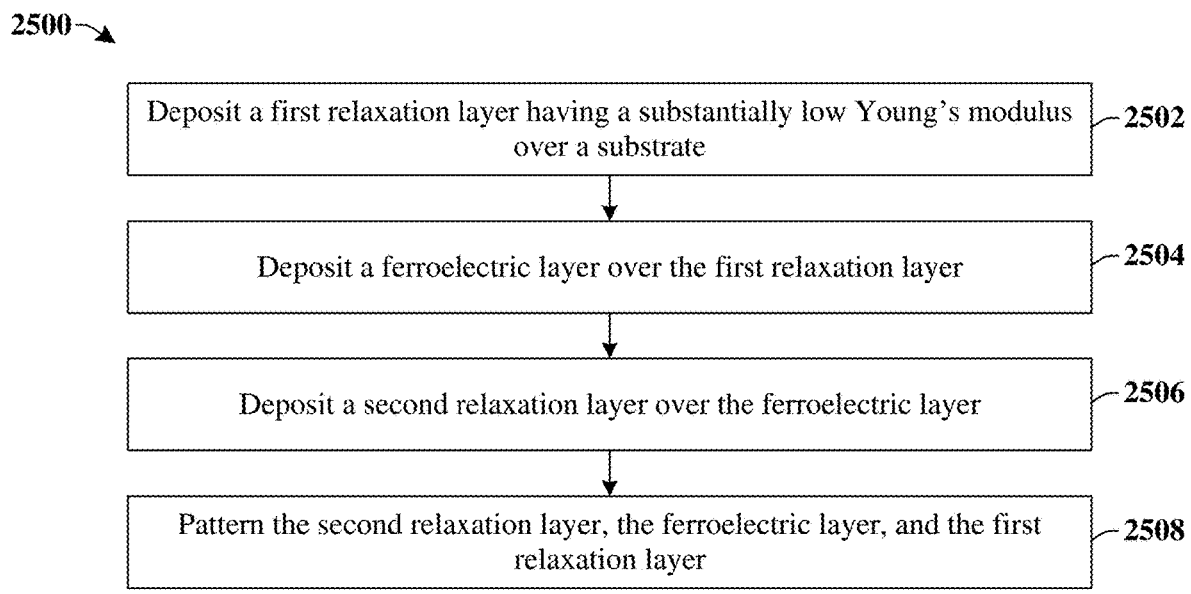
FIG. 25 illustrates a flow diagram of some embodiments of a method for forming a memory cell including a ferroelectric structure.

FIG. 25 illustrates a flow diagram of some embodiments of a method 2500 for forming a memory cell including a ferroelectric structure. While method 2500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 2502, deposit a first relaxation layer having a substantially low Young's modulus (e.g., a Young's modulus that is less than a Young's modulus of the subsequently deposited ferroelectric layer) over a substrate. FIGS. 7, 13, and 20 illustrate cross-sectional views 700, 1300, 2000, respectively, of some embodiments corresponding to block 2502.

At block 2504, deposit a ferroelectric layer over the first relaxation layer. In some examples, the ferroelectric layer has a substantially small thickness (e.g., less than 30 nanometers, less than 20 nanometers, less than 15 nanometers, between 5 and 30 nanometers, or some other suitable thickness). FIGS. 7, 13, and 20 illustrate cross-sectional views 700, 1300, 2000, respectively, of some embodiments corresponding to block 2504.

At block 2506, deposit a second relaxation layer over the ferroelectric layer. The second relaxation layer may also have a substantially low Young's modulus. FIGS. 7, 13, and 20 illustrate cross-sectional views 700, 1300, 2000, respectively, of some embodiments corresponding to block 2506.

At block 2508, pattern the second relaxation layer, the ferroelectric layer, and the first relaxation layer. The patterning forms (e.g., delimits) a ferroelectric structure from the second relaxation layer, the ferroelectric layer, and the first relaxation layer. FIGS. 8, 14, and 21 illustrate cross-sectional views 800, 1400, 2100, respectively, of some embodiments corresponding to block 2508.

Thus, the present disclosure relates to a memory cell and a method of forming a memory cell including one or more relaxation layers, neighboring a ferroelectric layer, for improving a performance of the memory cell.

Accordingly, in some embodiments, the present disclosure relates to an integrated chip. The integrated chip comprises a ferroelectric layer. The ferroelectric layer comprises a ferroelectric material. A first relaxation layer comprising a first material, different from the ferroelectric material, is on a first side of the ferroelectric layer. A second relaxation layer comprising a second material, different from the ferroelectric material, is on a second side of the ferroelectric layer, opposite the first side. A Young's modulus of the first relaxation layer is less than a Young's modulus of the ferroelectric layer.

In other embodiments, the present disclosure relates to an integrated chip comprising a ferroelectric layer. The ferroelectric layer comprises a ferroelectric material and has a substantially small thickness. A first relaxation layer comprising a first material, different from the ferroelectric material, is on a first side of the ferroelectric layer. A second relaxation layer comprising a second material, different from the ferroelectric material, is on a second side of the ferroelectric layer, opposite the first side. A difference between a lattice constant of the first relaxation layer and a lattice constant of the ferroelectric layer is greater than a threshold difference.

In yet other embodiments, the present disclosure relates to a method for forming an integrated chip. The method includes depositing a first relaxation layer comprising a first material over a substrate. A ferroelectric layer comprising a ferroelectric material, different from the first material, is deposited on the first relaxation layer. A second relaxation layer comprising a second material, different from the ferroelectric material, is deposited on the ferroelectric layer. The first relaxation layer, the ferroelectric layer, and the second relaxation layer are patterned. A Young's modulus of the first relaxation layer is less than a Young's modulus of the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    depositing a first relaxation layer comprising a first ferroelectric material over a substrate;
    depositing a ferroelectric layer comprising a second ferroelectric material, different from the first ferroelectric material, and having a Young's modulus that is greater than a Young's modulus of the first ferroelectric material, directly on a top surface of the first ferroelectric material;

depositing a second relaxation layer comprising a third-second material, different from the second ferroelectric material, on the ferroelectric layer; and patterning the first relaxation layer, the ferroelectric layer, and the second relaxation layer.

2. The method of claim 1, further comprising:

depositing a first outer layer over the substrate before depositing the first relaxation layer over the substrate, wherein the first outer layer comprises a fourth material different from the first ferroelectric material, the second ferroelectric material, and the third material; and depositing a second outer layer on the second relaxation layer, wherein the second outer layer comprises a fifth material different from the first ferroelectric material, the second ferroelectric material, and the third material.

3. The method of claim 1, wherein the second relaxation layer is deposited directly on a top surface of the ferroelectric layer, and wherein a Young's modulus of the second relaxation layer is less than the Young's modulus of the ferroelectric layer.

4. A method for forming an integrated chip, the method comprising:

depositing a first relaxation layer comprising a relaxation material over a substrate;

depositing a ferroelectric layer comprising a first ferroelectric material, different than the relaxation material, on the first relaxation layer;

depositing a second relaxation layer comprising a second ferroelectric material, different than the first ferroelectric material, directly on a top surface of the ferroelectric layer; and patterning the first relaxation layer, the ferroelectric layer, and the second relaxation layer, wherein a lattice constant of the first relaxation layer is substantially different than a lattice constant of the ferroelectric layer, and wherein a Young's modulus of the second relaxation layer is less than a Young's modulus of the ferroelectric layer.

5. The method of claim 4, wherein a difference between the lattice constant of the first relaxation layer and the lattice constant of the ferroelectric layer is greater than 1 percent.

6. The method of claim 4, wherein a lattice constant of the second relaxation layer is substantially different than the lattice constant of the ferroelectric layer.

7. The method of claim 4, further comprising:

depositing a first outer layer comprising a third material, different than the relaxation material, the second ferroelectric material, and the first ferroelectric material, on the second relaxation layer;

forming a gate contact over and coupled to the second relaxation layer.

8. The method of claim 7, further comprising:

forming a second outer layer comprising a fourth material, different than the relaxation material, the second ferroelectric material, and the first ferroelectric material, wherein the first relaxation layer is deposited on the second outer layer.

9. A method for forming an integrated chip, the method comprising:

forming a first relaxation layer comprising a first ferroelectric material;

depositing a ferroelectric layer comprising a second ferroelectric material, different from the first ferroelectric material, directly on a top surface of the first relaxation layer;

depositing a second relaxation layer comprising a relaxation material, different from the second ferroelectric material, on the ferroelectric layer; and etching the ferroelectric layer and the second relaxation layer, wherein a Young's modulus of the first relaxation layer is less than a Young's modulus of the ferroelectric layer.

10. The method of claim 9, further comprising:

forming a transistor along a semiconductor substrate, the transistor comprising a first source/drain, a second source/drain, and a gate; and forming a contact on the first source/drain of the transistor, wherein the first relaxation layer is formed over the contact and is coupled to the contact.

11. The method of claim 9, wherein the ferroelectric layer and the second relaxation layer are formed over a semiconductor substrate, the method further comprising:

forming a first source/drain region and a second source/drain region in the semiconductor substrate on opposite sides of the ferroelectric layer after etching the ferroelectric layer and the second relaxation layer; and froming a gate contact over and coupled to the second relaxation layer.

12. The method of claim 9, further comprising:

forming a first source/drain structure and a second source/drain structure laterally spaced apart over the ferroelectric layer and the second relaxation layer.

13. The method of claim 9, wherein the second relaxation layer is deposited directly on a top surface of the ferroelectric layer, and wherein a Young's modulus of the second relaxation layer is less than the Young's modulus of the ferroelectric layer.

14. The method of claim 13, wherein the relaxation material is a third ferroelectric material, different than the second ferroelectric material.

15. The method of claim 14, wherein the third ferroelectric material is different than the first ferroelectric material.

16. The method of claim 9, further comprising:

forming a first outer layer comprising a third material, different than the first ferroelectric material, the relaxation material, and the second ferroelectric material, before forming the first relaxation layer, wherein the first relaxation layer is formed on the first outer layer; and forming a second outer layer comprising a fourth material, different than the first ferroelectric material, the relaxation material, and the second ferroelectric material, on the second relaxation layer.

17. The method of claim 16, further comprising:

depositing an insulator layer over a substrate, wherein the first outer layer is formed on the insulator layer;

forming a channel layer over the ferroelectric layer and on the second outer layer;

etching the first outer layer, the first relaxation layer, the ferroelectric layer, the second relaxation layer, the second outer layer, and the channel layer; and forming a first source/drain structure and a second source/drain structure laterally spaced apart over the ferroelectric layer and on a top surface of the channel layer.

18. The method of claim 16, wherein a thickness of the ferroelectric layer is less than a thickness of the first outer layer, less than a thickness of the second outer layer, greater than a thickness of the first relaxation layer, and greater than a thickness of the second relaxation layer.

19. The method of claim 9, wherein a thickness of the ferroelectric layer is different than a thickness of the first relaxation layer and a thickness of the second relaxation layer.

20. The method of claim 9, wherein the first ferroelectric material is different from the relaxation material.

\* \* \* \* \*